(12) United States Patent
Inamasu et al.

(10) Patent No.: US 9,468,946 B2
(45) Date of Patent: Oct. 18, 2016

(54) WIPING PAD, AND NOZZLE MAINTENANCE APPARATUS AND COATING TREATMENT APPARATUS USING WIPING PAD

(71) Applicant: Tokyo Electron Limited, Tokyo (JP)

(72) Inventors: Toshifumi Inamasu, Koshi (JP); Yukio Ogasawara, Koshi (JP); Kei Tashiro, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 151 days.

(21) Appl. No.: 14/374,685

(22) PCT Filed: Jan. 17, 2013

(86) PCT No.: PCT/JP2013/050743
§ 371 (c)(1),
(2) Date: Jul. 25, 2014

(87) PCT Pub. No.: WO2013/118550
PCT Pub. Date: Aug. 15, 2013

(65) Prior Publication Data
US 2014/0373779 A1    Dec. 25, 2014

(30) Foreign Application Priority Data

Feb. 10, 2012  (JP) ................. 2012-026822

(51) Int. Cl.
*B05C 11/00* (2006.01)
*B05B 15/02* (2006.01)
*B05C 5/02* (2006.01)
(Continued)

(52) U.S. Cl.
CPC ............ *B05C 11/00* (2013.01); *B05B 15/025* (2013.01); *B05B 15/0208* (2013.01); *B05B 15/0275* (2013.01); *B05C 5/0254* (2013.01);
(Continued)

(58) Field of Classification Search
CPC ............ B05B 15/0208; B05B 15/025; B05B 15/0275; B05B 7/206; B08B 1/006; B08B 3/024; B05C 5/0254
See application file for complete search history.

(56) References Cited

U.S. PATENT DOCUMENTS

2004/0213913 A1* 10/2004  Jung .................. B05B 15/0258
427/420

FOREIGN PATENT DOCUMENTS

| JP | H11-300261 A | 11/1999 |
|---|---|---|
| JP | 2005-270841 A | 10/2005 |
| JP | 2006-167508 A | 6/2006 |
| JP | 4040025 B2 | 11/2007 |
| JP | 2008-136897 A | 6/2008 |

(Continued)

OTHER PUBLICATIONS

International Search Report of the International Searching Authority mailed Apr. 23, 2013 for the corresponding international application No. PCT/JP2013/050743 (with English translation).

*Primary Examiner* — Laura Edwards
(74) *Attorney, Agent, or Firm* — Posz Law Group, PLC

(57) ABSTRACT

A wiping pad includes: a scraping edge provided to cross a long side direction of a discharge port and come into contact with the discharge port and nozzle side surfaces, and a lead-out passage provided ahead of the scraping edge in a moving direction along a nozzle long side direction to drain a treatment solution scraped away with the scraping edge, wherein the lead-out passage is a V-shaped groove formed along the moving direction on a pad upper surface side, and the V-shaped groove has the scraping edge formed at a rear end edge portion thereof and is formed to gradually increase in groove width and depth toward a front thereof from the scraping edge.

13 Claims, 18 Drawing Sheets

(51) Int. Cl.
  B08B 1/00   (2006.01)
  *B41J 2/165*   (2006.01)
  *H01L 21/67*   (2006.01)
(52) U.S. Cl.
  CPC ............ B08B 1/006 (2013.01); *B41J 2/16517* (2013.01); *B41J 2/16535* (2013.01); *H01L 21/67051* (2013.01)

(56) References Cited

FOREIGN PATENT DOCUMENTS

| | | |
|---|---|---|
| JP | 2008-268906 A | 11/2008 |
| JP | 2011-167607 A | 9/2011 |
| JP | 2012-185404 A | 9/2012 |
| JP | 2012-232269 A | 11/2012 |

\* cited by examiner

US 9,468,946 B2

WIPING PAD, AND NOZZLE MAINTENANCE APPARATUS AND COATING TREATMENT APPARATUS USING WIPING PAD

TECHNICAL FIELD

The present invention relates to a wiping pad, and a nozzle maintenance apparatus and a coating treatment apparatus using the pad, and particularly to a wiping pad that performs a wiping treatment of a treatment solution for a nozzle tip which is formed with a discharge port in a slit shape and to which the treatment solution discharged from the discharge port adheres, and to a nozzle maintenance apparatus and a coating treatment apparatus using the pad.

This application is based upon and claims the benefit of priority of the prior Japanese Patent Application No. 2012-026822, filed in Japan on Feb. 10, 2012, the entire contents of which are incorporated herein by reference.

BACKGROUND ART

For example, in a manufacture of an FPD (flat panel display), a circuit pattern is formed by a so-called photolithography process.

In the photolithography process, a predetermined film is formed on a substrate to be treated such as a glass substrate, and then a photoresist (hereinafter, referred to as a resist or a resist solution) being a treatment solution is applied to form a resist film (photosensitive film). Then, the resist film is exposed to light corresponding to the circuit pattern, and subjected to developing treatment to form into a pattern.

As a method of applying the resist solution to the substrate to be treated to form the resist film in the photolithography process, there is a method of discharging the resist solution in a band shape from a discharge port in a slit shape to thereby apply the resist on the substrate.

A conventional resist coating apparatus using this method will be briefly described using FIG. 29.

A resist coating apparatus 200 illustrated in FIG. 29 includes a stage 201 on which a substrate G is mounted, a resist supply nozzle 202 that is arranged above the stage 201, and a nozzle moving means 203 that moves the nozzle 202.

The nozzle 202 is provided with a discharge port 202a in a slit shape having a small gap extending in a width direction of the substrate G, and configured to discharge a resist solution R supplied from a resist solution supply source 204 from the discharge port 202a.

However, the discharge port 202a in a slit shape is formed of the small gap and is therefore susceptible to clogging due to drying up of the resist solution if a nozzle tip (discharge port 202a) after coating treatment is left as it is, and cannot perform uniform discharge in the nozzle width direction any longer as illustrated in FIG. 30.

Therefore, the resist coating apparatus 200 includes a priming means 208 configured to prepare the state of the resist solution R that adheres to the nozzle tip and remains after the coating treatment as illustrated in FIG. 29.

The priming means 208 is for discharging, before the coating treatment on the substrate G, the resist solution R to the surface of a rotatable priming roller 207 in a cylindrical shape to uniformize the resist solution R adhering to the nozzle tip (hereafter, referred to as a priming treatment).

In this configuration, in the resist coating treatment on the substrate G, the resist solution R is discharged in a band shape to the entire surface of the substrate G from the discharge port 202a in a slit shape while the nozzle 202 is being horizontally moved by the nozzle moving means 203, whereby the coating treatment of the resist solution R is performed.

Further, in the waiting time of the nozzle 202, the priming treatment of the nozzle 202 is performed by the priming means 208. In the priming treatment, the resist solution R uniform in the substrate width direction is made to adhere in a bead line shape on the rear side in the coating direction of the discharge port 202a of the nozzle 202, thereby making it possible to perform uniform coating treatment from the start time of the next coating treatment.

Note that the resist coating apparatus is described in Patent Document 1.

PRIOR ART DOCUMENT

Patent Document

[Patent Document 1] Japanese Patent No. 4040025

DISCLOSURE OF THE INVENTION

Problems to be Solved by the Invention

As described above, the priming treatment is performed for the nozzle 202 having the discharge port 202a in a slit shape extending in the substrate width direction before the coating treatment on the substrate G, and thereby can prepare the state of the resist solution R adhering to the nozzle tip.

However, it is necessary to discharge a large amount of the resist solution R to the roller surface of the rotating priming roller 207 in the priming treatment, thus causing a problem of too much (wasteful) consumption of the resist solution R.

There also is a need to clean the priming roller 207 after the priming treatment, which requires a large amount of cleaning solution to be stored in a storage tank 209, thus causing a problem of increased cost.

Furthermore, the priming treatment and the cleaning treatment of the priming roller 207 require a long time and increase the tact time, thus causing a problem of decreased productivity.

The present invention has been made in consideration of the above problems, and its object is to provide a wiping pad capable of eliminating wasteful consumption of a chemical such as a treatment solution and reducing the tact time to improve the productivity in a maintenance apparatus that performs a wiping treatment of the treatment solution for a nozzle tip which is formed with a discharge port in a slit shape extending in a width direction of a substrate to be treated and to which the treatment solution discharged from the discharge port adheres, and provide a nozzle maintenance apparatus and a coating treatment apparatus using the pad.

Means for Solving the Problems

To solve the above problem, a wiping pad according to the present invention is a wiping pad moved from one end side to another end side in a nozzle long side direction for wiping away a treatment solution adhering to a discharge port and nozzle side surfaces of a nozzle, the nozzle having the discharge port in a slit shape long in a width direction of a substrate to be treated and the nozzle side surfaces extending in parallel with the discharge port on both front and rear sides of the discharge port and formed in a tapered shape gradually getting thinner from a top to a bottom toward the discharge port, the wiping pad including: a scraping edge provided to cross a long side direction of the discharge port and come into contact with the discharge port and the nozzle side surfaces, and a lead-out passage provided ahead of the scraping edge in a moving direction along the nozzle long side direction to drain the treatment solution scraped away with the scraping edge, wherein the lead-out passage is a V-shaped groove formed along the moving direction on a pad upper surface side, and the V-shaped groove has the scraping edge formed at a rear end edge portion thereof and is formed to gradually increase in groove width and depth toward a front thereof from the scraping edge.

Alternatively, to solve the aforementioned problem, a wiping pad according to the present invention is a wiping pad moved from one end side to another end side in a nozzle long side direction for wiping away a treatment solution adhering to a discharge port and nozzle side surfaces of a nozzle, the nozzle having the discharge port in a slit shape long in a width direction of a substrate to be treated and the nozzle side surfaces extending in parallel with the discharge port on both front and rear sides of the discharge port and formed in a tapered shape gradually getting thinner from a top to a bottom toward the discharge port, the wiping pad including: a scraping edge provided to cross a long side direction of the discharge port and come into contact with the discharge port and the nozzle side surfaces, and a lead-out passage provided ahead of the scraping edge in a moving direction along the nozzle long side direction to drain the treatment solution scraped away with the scraping edge, wherein the scraping edge is formed in a V-shape in a front view at an upper portion of a pad front surface in the moving direction, and provided with a flange part projecting forward on both right and left sides of the scraping edge and thereby formed in a V-shape widening from a middle to both right and left sides toward a front in a plan view, and wherein the lead-out passage is formed of a pad front surface side including a lower surface of the flange part.

This configuration makes it possible to scrape away excessive treatment solution adhering to the nozzle tip with the scraping edge after the coating treatment of the treatment solution to the substrate to be treated, and effectively wipe away the scraped treatment solution, without allowing it to escape to the rear of the (moving) wiping pad.

As a result, it becomes unnecessary to provide the priming roller as in the prior art and to discharge the treatment solution to a roller surface for the priming treatment, thereby reducing the consumption of the treatment solution.

Further, it is possible to greatly reduce, as compared with the priming treatment using the conventional priming roller, the time required for the maintenance treatment of the nozzle tip and thus reduce the tact time, thereby improving the productivity. Furthermore, since the priming roller is unnecessary, the cleaning solution used for cleaning the roller also becomes unnecessary, thereby making it possible to greatly reduce the cost.

Further, to solve the aforementioned problem, a nozzle maintenance apparatus according to the present invention is a nozzle maintenance apparatus for wiping away a treatment solution adhering to a discharge port and nozzle side surfaces of a nozzle, the nozzle having the discharge port in a slit shape long in a width direction of a substrate to be treated and the nozzle side surfaces extending in parallel with the discharge port on both front and rear sides of the discharge port and formed in a tapered shape gradually getting thinner from a top to a bottom toward the discharge port, the nozzle maintenance apparatus including: a wiping pad including a scraping edge provided to cross a long side direction of the discharge port and come into contact with the discharge port and the nozzle side surfaces, and a lead-out passage provided ahead of the scraping edge in a moving direction along the nozzle long side direction to drain the treatment solution scraped away with the scraping edge; and a pad moving means configured to hold the wiping pad in a standing posture and move the wiping pad from one end to another end of the nozzle along the nozzle long side direction, wherein the lead-out passage of the wiping pad is a V-shaped groove formed along the moving direction on a pad upper surface side, and the V-shaped groove has the scraping edge formed at a rear end edge portion thereof and is formed to gradually increase in move width and depth toward a front thereof from the scraping edge.

Alternatively, to solve the aforementioned problem, a nozzle maintenance apparatus according to the present invention is a nozzle maintenance apparatus for wiping away a treatment solution adhering to a discharge port and nozzle side surfaces of a nozzle, the nozzle having the discharge port in a slit shape long in a width direction of a substrate to be treated and the nozzle side surfaces extending in parallel with the discharge port on both front and rear sides of the discharge port and formed in a tapered shape gradually getting thinner from a top to a bottom toward the discharge port, the nozzle maintenance apparatus including: a wiping pad including a scraping edge provided to cross a long side direction of the discharge port and come into contact with the discharge port and the nozzle side surfaces, and a lead-out passage provided ahead of the scraping edge in a moving direction along the nozzle long side direction to drain the treatment solution scraped away with the scraping edge; and a pad moving means configured to hold the wiping pad in a standing posture and move the wiping pad from one end to another end of the nozzle along the nozzle long side direction, wherein the scraping edge of the wiping pad is formed in a V-shape in a front view at an upper portion of a pad front surface in the moving direction, and provided with a flange part projecting forward on both right and left sides of the scraping edge and thereby formed in a V-shape widening from a middle to both right and left sides toward a front in a plan view, and the lead-out passage is formed of a pad front surface side including a lower surface of the flange part.

This configuration makes it possible to scrape away excessive treatment solution adhering to the nozzle tip with the scraping edge after the coating treatment of the treatment solution to the substrate to be treated, and effectively wipe away the scraped treatment solution, without allowing it to escape to the rear of the (moving) wiping pad.

As a result, it becomes unnecessary to provide the priming roller as in the prior art and to discharge the treatment solution to a roller surface for the priming treatment, thereby reducing the consumption of the treatment solution.

Further, it is possible to greatly reduce, as compared with the priming treatment using the conventional priming roller, the time required for the maintenance treatment of the nozzle tip and thus reduce the tact time, thereby improving the productivity. Furthermore, since the priming roller is unnecessary, the cleaning solution used for cleaning the roller also becomes unnecessary, thereby making it possible to greatly reduce the cost.

Further, to solve the aforementioned problem, a coating treatment apparatus according to the present invention is a coating treatment apparatus using a nozzle maintenance apparatus for wiping away a treatment solution adhering to a discharge port and nozzle side surfaces of a nozzle, the nozzle having the discharge port in a slit shape long in a width direction of a substrate to be treated and the nozzle side surfaces extending in parallel with the discharge port on both front and rear sides of the discharge port and formed in a tapered shape gradually getting thinner from a top to a bottom toward the discharge port, the nozzle maintenance apparatus including: a wiping pad including a scraping edge provided to cross a long side direction of the discharge port and come into contact with the discharge port and the nozzle side surfaces, and a lead-out passage provided ahead of the scraping edge in a moving direction along the nozzle long side direction to drain the treatment solution scraped away with the scraping edge; and a pad moving means configured to hold the wiping pad in a standing posture and move the wiping pad from one end to another end of the nozzle along the nozzle long side direction, wherein the lead-out passage of the wiping pad is a V-shaped groove formed along the moving direction on a pad upper surface side, and the V-shaped groove has the scraping edge formed at a rear end edge portion thereof and is formed to gradually increase in groove width and depth toward a front thereof from the scraping edge, the coating treatment apparatus including: the nozzle maintenance apparatus; the nozzle configured to discharge the treatment solution from the discharge port in a slit shape extending in the width direction of the substrate to be treated to a substrate surface of the substrate to be treated; and a relative moving means configured to relatively move the nozzle and the substrate to be treated so that the nozzle scans from one end to another end of the substrate surface of the substrate to be treated.

This configuration makes it possible to eliminate wasteful consumption of a chemical such as a treatment solution and reduce the tact time to improve the productivity.

Effect of the Invention

According to the present invention, it is possible to obtain a wiping pad, a nozzle maintenance apparatus and a coating treatment apparatus, capable of eliminating wasteful consumption of a chemical such as a treatment solution and reducing the tact time to improve the productivity when performing a wiping treatment of the treatment solution for a nozzle tip which is formed with a discharge port in a slit shape extending in a width direction of a substrate to be treated and to which the treatment solution discharged from the discharge port adheres.

BEST MODE FOR CARRYING OUT THE INVENTION

Hereinafter, an embodiment relating to a wiping pad of the present invention and a nozzle maintenance apparatus and a coating treatment apparatus using the pad will be described based on the drawings. Note that in this embodiment, an example of a case in which the pad is applied to a coating treatment apparatus that discharged a resist solution being a treatment solution onto a glass substrate used as a substrate to be treated from a nozzle to form a resist coating film and to a nozzle maintenance apparatus that fixes the state of a discharge port of the nozzle to which the resist solution adheres will be described.

Figure 1:
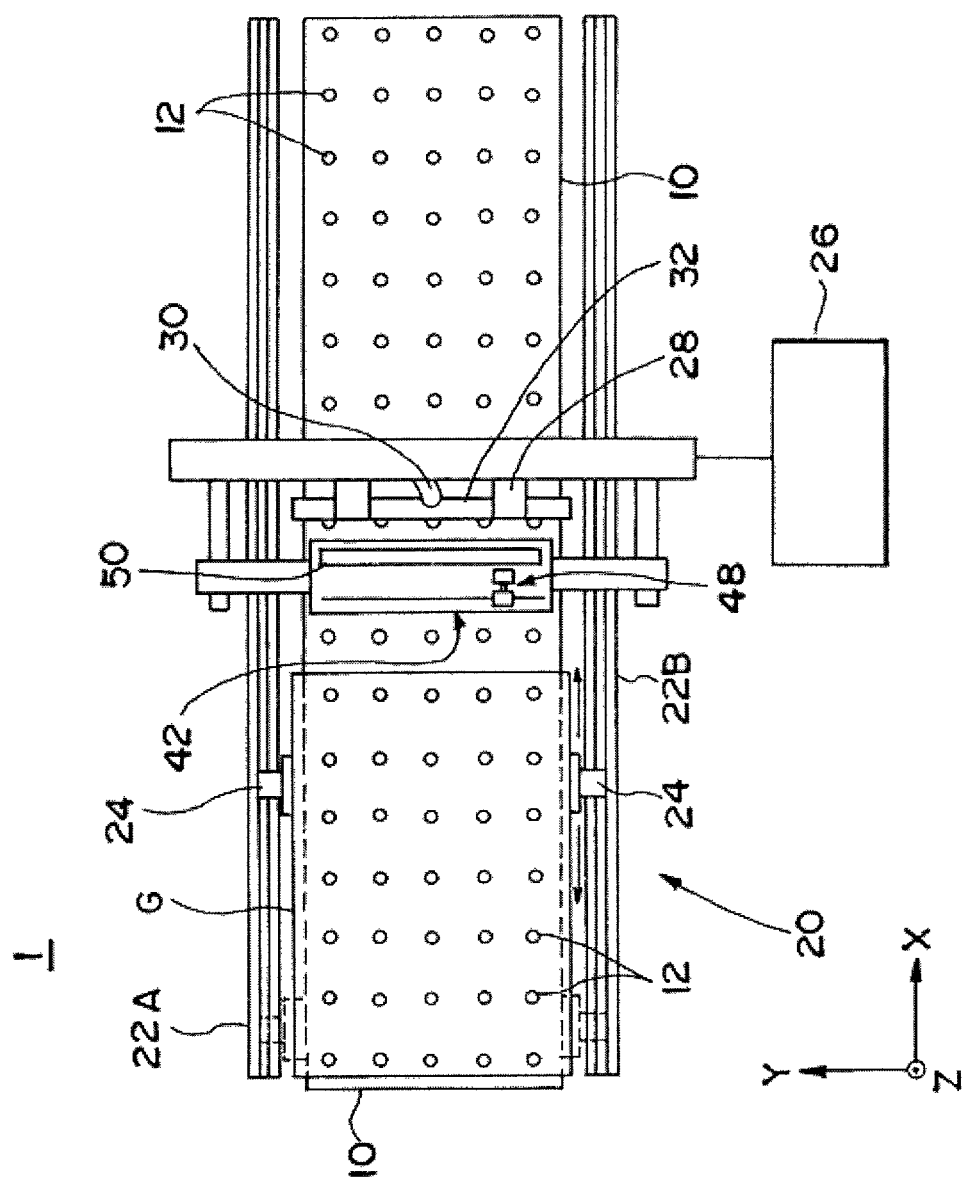
FIG. 1 is a plan view illustrating a configuration example of a resist coating apparatus to which a nozzle maintenance apparatus according to the present invention is applicable.

FIG. 1 is a plan view illustrating a schematic configuration of a resist coating apparatus (coating treatment apparatus) capable of mounting the nozzle maintenance apparatus according to the present invention thereon.

A resist coating apparatus 1 has a floating stage 10 that floats the substrate to be treated, for example, a glass substrate G for FPD in the air by the pressure of gas, a substrate transfer mechanism 20 (relative moving means) that transfers the substrate G floating above the floating stage 10 in a stage long side direction (X-direction), a nozzle 32 that supplies a resist solution onto an upper surface of the substrate G transferred above the floating stage 10, and a waiting unit 42 (nozzle maintenance apparatus) that keeps the nozzle 32 waiting therein and performs a predetermined maintenance treatment for the nozzle 32 between coating treatments.

The upper surface of the floating stage 10 is provided with many gas jetting ports 12 that jet a predetermined gas (for example, air) upward, so that the substrate G floats at a predetermined height from the stage upper surface by the pressure of the gas jetted from the gas jetting ports 12.

The substrate transfer mechanism 20 includes a pair of guide rails 22A, 22B extending in the X-direction across the floating stage 10, a pair of sliders 24 capable of reciprocating along the guide rails 22A, 22B, and substrate holding members (not illustrated) such as suction pads or the like provided on the sliders 24 so as to attachably/detachably hold the end portions on both sides of the substrate G above the floating stage 10. Further, the sliders 24 are moved by straight moving mechanism (not illustrated) in a transfer direction (X-direction) to thereby transfer the substrate G floating above the floating stage 10.

Figure 2:
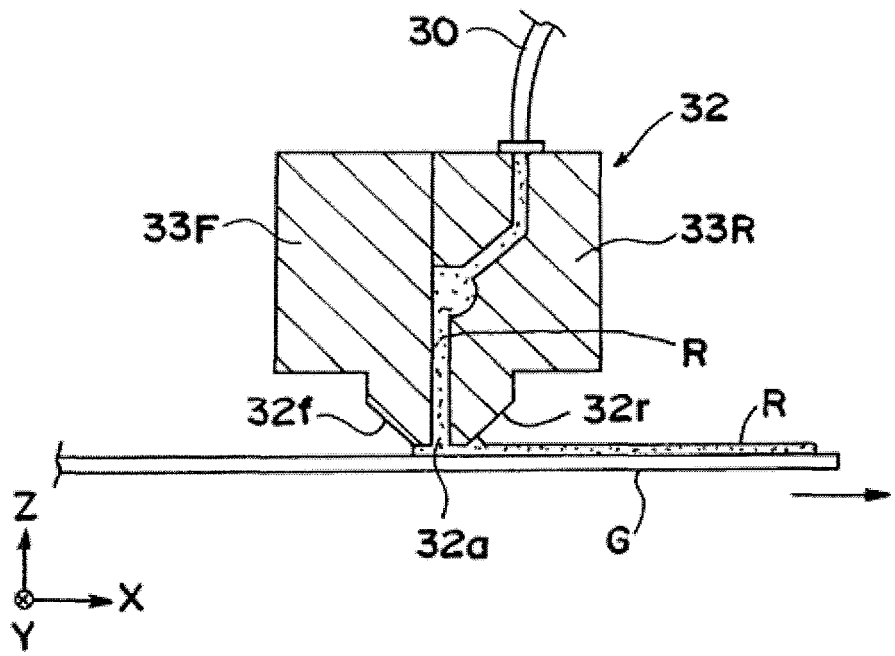
FIG. 2 is a cross-sectional view of a nozzle included in the resist coating apparatus in FIG. 1.
Figure 3:
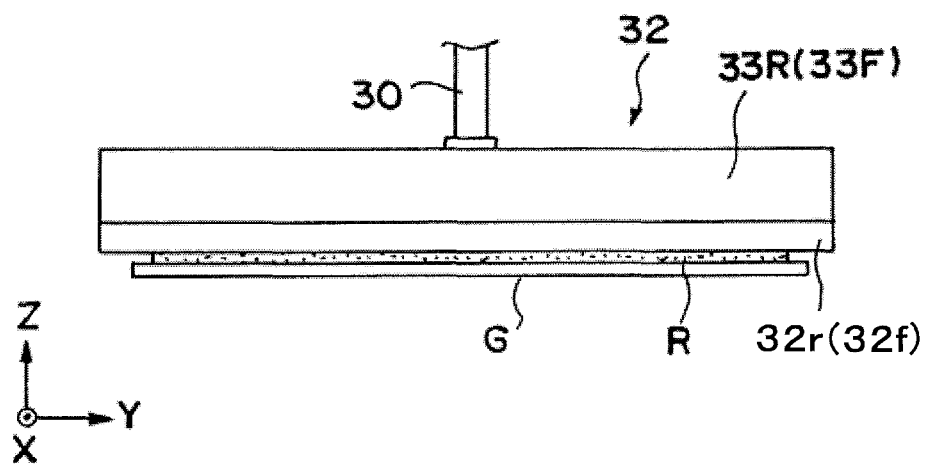
FIG. 3 is a front view of the nozzle included in the resist coating apparatus in FIG. 1.

Further, the nozzle 32 crosses in a horizontal direction (Y-direction) perpendicular to the transfer direction (X-direction) above the floating stage 10 as illustrated in FIG. 1 to FIG. 3 so as to discharge a resist solution R in a band shape from a discharge port 32a in a slit shape onto the upper surface (surface to be treated) of the substrate G passing directly below it. The nozzle 32 is configured to be able to move and rise and lower in the vertical direction (Z-direction) together with a nozzle support member 28 that supports the nozzle 32, by means of a nozzle raising and lowering mechanism 26 including, for example, a ball screw mechanism, a guide member and so on. Further, the nozzle 32 is connected, via a resist supply pipe 30, to a resist supply unit (not illustrated) composed of a resist solution container, a solution sending pump and so on.

As illustrated in FIG. 2, the nozzle 32 is composed of a front lip 33F and a rear lip 33R extending in parallel with the nozzle long side direction (Y-direction) such that the pair of lips 33F, 33R are brought into abutment against each other and integrally combined by a bolt and so on, and thus has the discharge port 32a in a slit shape.

Nozzle side surfaces 32f, 32r on both front and rear sides extending in parallel with the discharge port 32a of the nozzle 32 are formed in a tapered shape gradually getting thinner from the top to the bottom toward the discharge port 32a.

Note that at the time of applying the resist to the substrate G, not only the discharge port 32a but also the lower end portions of the nozzle side surfaces 32f, 32r on both sides thereof are wetted with the resist solution R, and dirt of the resist solution R remains at the discharge port 32a and the lower end portions of the nozzle side surfaces 32f, 32r after finish of the resist coating treatment.

The waiting unit 42 is provided adjacent to the nozzle 32 and above the floating stage 10 as illustrated in FIG. 1.

Figure 4:
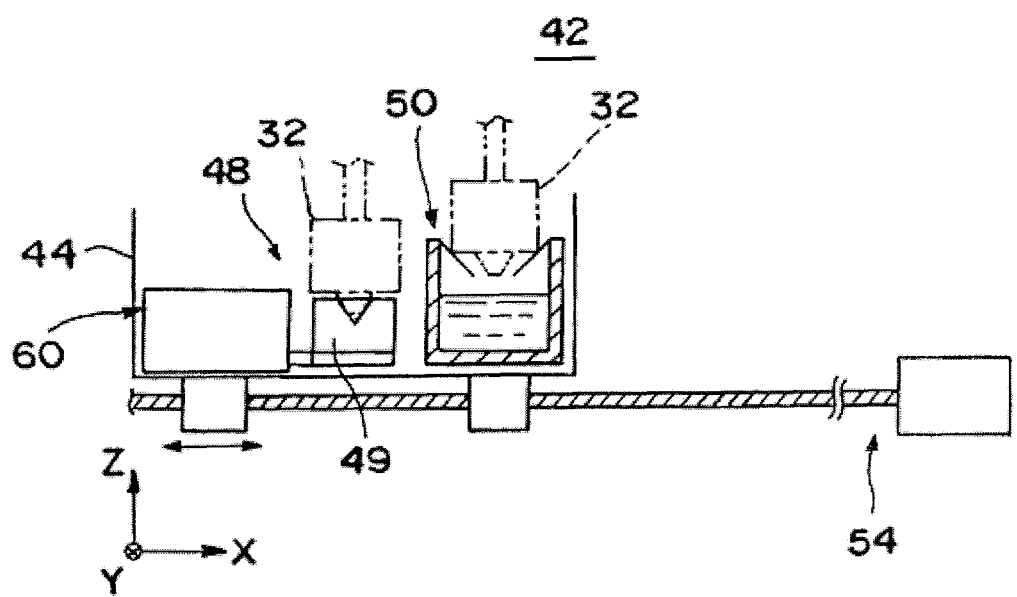
FIG. 4 is a cross-sectional view illustrating a schematic configuration of a waiting unit (nozzle maintenance apparatus) included in the resist coating apparatus in FIG. 1.

The waiting unit 42 has a swipe part 48 that wipes away the resist solution R adhering to the nozzle tip (the discharge port 32a and its surroundings) as preparation of the coating treatment, and a nozzle bath 50 for keeping the discharge port 32a from which excessive resist solution R has been wiped away in the swipe part 48 in an atmosphere of a solvent vapor for the purpose of preventing drying up, in one casing 44 as illustrated in FIG. 4.

In other words, the nozzle 32 is configured to perform the coating treatment on the substrate after being subjected to the wiping treatment of the resist solution R adhering to the nozzle tip by the swipe part 48, and then wait in the nozzle bath 50.

When placing the nozzle 32 to correspond to the parts 48, 50 of the waiting unit 42, the whole waiting unit 42 is moved in the substrate transfer direction (X-direction) by an X-direction moving part 54 composed of, for example, a ball screw mechanism, and the nozzle 32 is moved in the vertical direction (Z-direction) by the nozzle raising and lowering mechanism 26 under control of a controller (not illustrated).

Figure 5:
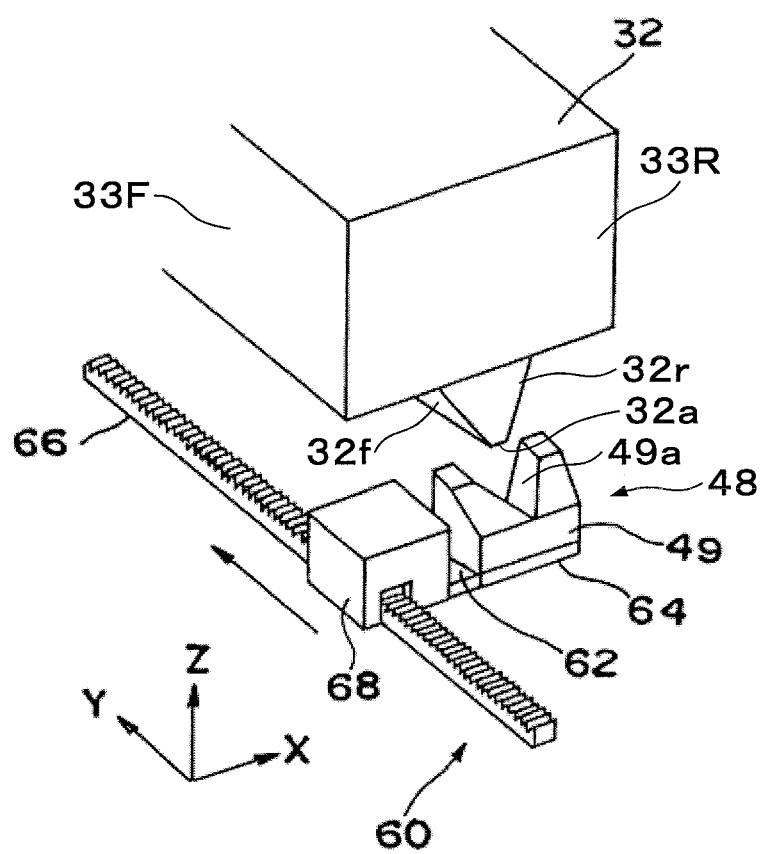
FIG. 5 is a perspective view of a swipe part included in the waiting unit in FIG. 4.

Further, as illustrated in FIG. 4, FIG. 5, the swipe part 48 has a wiping pad 49 for wiping the periphery of the discharge port of the nozzle 32.

The wiping pad 49 has a thickness of, for example, 15 mm along the nozzle long side direction (Y-direction) and a lateral width of, for example, 30 mm in the nozzle short side direction (X-direction). The wiping pad 49 also has a height of, for example, 26 mm.

The wiping pad 49 also has a V-shaped groove 49a formed along the nozzle long side direction on its upper surface side, and the V-shaped groove 49a is formed in a shape corresponding to the shapes of the discharge port 32a and the nozzle side surfaces 32f, 32r of the nozzle 32 as illustrated in FIG. 5. In other words, the V-shaped groove 49a engages with the discharge port 32a and the nozzle side surfaces 32f, 32r and the wiping pad 49 is moved in the nozzle long side direction (Y-direction) to thereby wipe away the excessive resist solution R adhering to the nozzle tip.

Note that the wiping pad 49 is formed of a material having flexibility and chemical resistance, for example, silicon rubber or fluorine rubber.

Further, the wiping pad 49 is formed to be as large as 15 mm thickness along the moving direction (Y-direction) with respect to the lateral width dimension of, for example, 30 mm. Therefore, the wiping pad 49 never greatly bends along the nozzle tip during movement, thereby preventing failure such as scattering of the resist solution R from occurring due to rebound of bending.

As illustrated in FIG. 5, the wiping pad 49 is held in a standing posture on a carriage 64 combined with a Y-direction moving part 60 (pad moving means) via a joint member 62. Further, the carriage 64 is movable along the long side direction of the discharge port 32a by means of the Y-direction moving part 60. The Y-direction moving part 60 is composed of, for example, a rack-and-pinion mechanism, and has a rack 66 extending in the Y-direction and a movable unit 68 incorporating a gear (not illustrated) rolling on the rack 66. The carriage 64 is aligned with the peripheral portion of the discharge port of the nozzle 32 and then moved in the wiping direction (Y direction).

Subsequently, a first embodiment of the wiping pad 49 will be described using FIG. 6 to FIG. 9.

Figure 6:
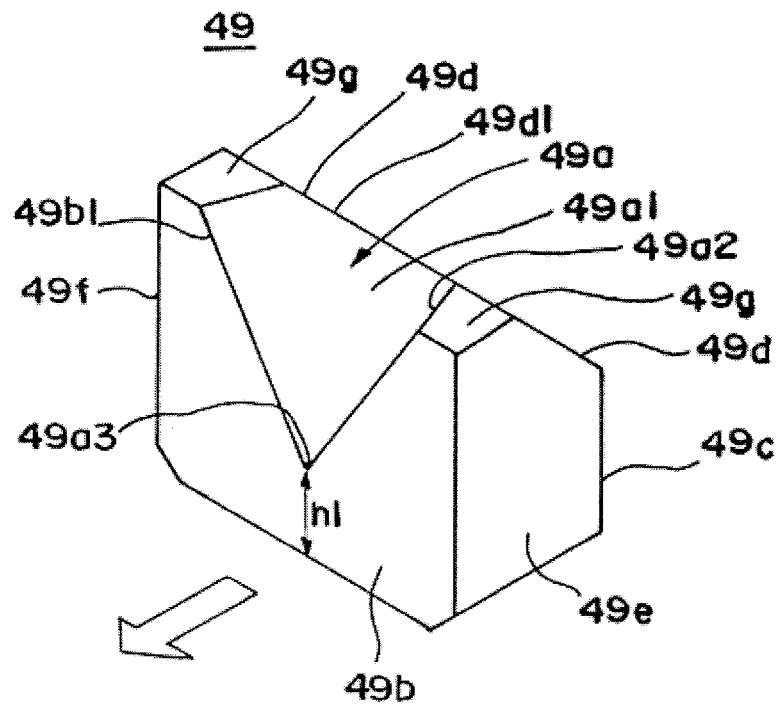
FIG. 6 is a view illustrating a first embodiment of a wiping pad included in the swipe part in FIG. 5, and a perspective view as viewed from the front side in its moving direction.
Figure 7:
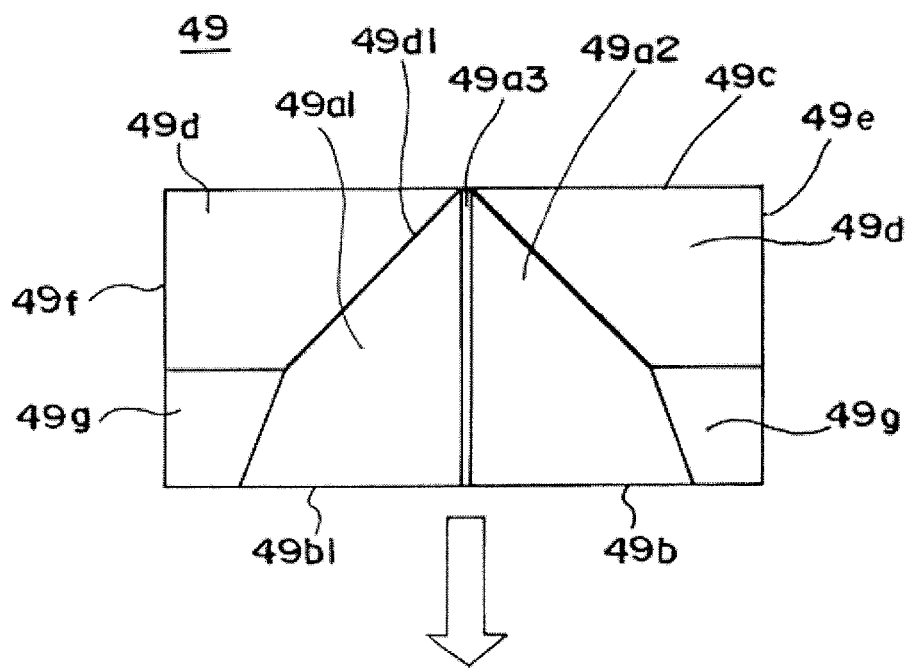
FIG. 7 is a plan view of the wiping pad in FIG. 6.
Figure 8:
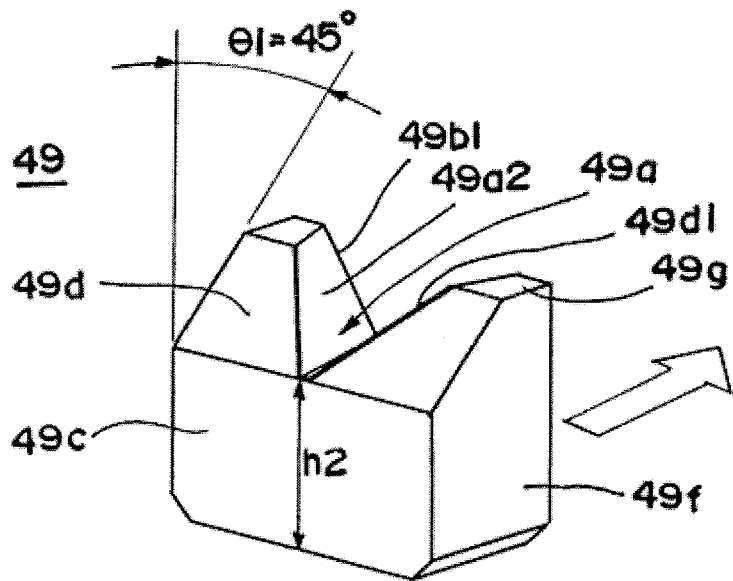
FIG. 8 is a perspective view of the wiping pad in FIG. 6 as viewed from the rear side in its moving direction.
Figure 9:
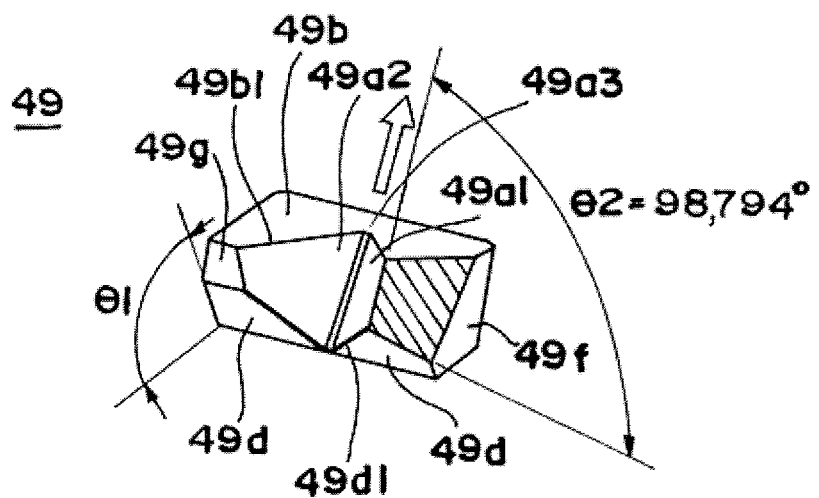
FIG. 9 is a perspective view of the wiping pad in FIG. 6 with its partial cross-section.

FIG. 6 illustrates a perspective view of the wiping pad 49 as viewed from front side in its moving direction (by the Y-direction moving part 60), and FIG. 7 illustrates a plan view. Further, FIG. 8 illustrates a perspective view of the pad 49 as viewed from rear side in its moving direction (by the Y-direction moving part 60), and FIG. 9 illustrates a perspective view of the pad 49 with its partial cross-section. Note that arrows illustrated in FIG. 6 to FIG. 9 indicate the moving direction of the wiping pad 49 by the Y-direction moving part 60.

As illustrated in FIG. 6 to FIG. 9, the wiping pad 49 has a front surface 49*b* formed on the moving direction side indicated with the arrow, and a rear surface 49*c* and an inclined surface 49*d* formed on the moving direction rear side. Further, side surfaces 49*e*, 49*f* are formed on both left and right sides respectively, and upper surfaces 49*g* are formed on the upper side.

Further, in the V-shaped groove 49*a*, opposing inclined surfaces 49*a*1, 49*a*2 are formed, and a bottom part 49*a*3 with a predetermined length is linearly firmed in the pad moving direction (Y-direction) at the lower end portion between them.

Further, as illustrated in FIG. 6, an edge in a V-shape (called a V-shaped edge) 49*b*1 is formed by a front end edge portion of the V-shaped groove 49*a*. Further, as illustrated in FIG. 8, an edge in a V-shape (called a V-shaped edge) 49*d*1 by a rear end edge portion of the V-shaped groove 49*a* is formed as a scraping edge on the inclined surface 49*d* on the pad rear side.

In the wiping operation for the nozzle tip by the wiping pad 49, only the V-shaped edge 49*d*1 on the pad rear side comes into contact with the discharge port 32*a* and the nozzle side surfaces 32*f*, 32*r* of the nozzle 32. This is because the V-shaped groove 49*a* is formed such that a height dimension h1 (FIG. 6) of a bottom portion of the V-shaped edge 49*b*1 on the pad front side is lower than a height dimension h2 (FIG. 8) of a bottom portion of the V-shaped edge 49*d*1 on the pad rear side (namely, the groove depth of the V-shaped groove 49*a* gradually becomes deeper as it goes toward the pad moving direction), and the groove width of the V-shaped groove 49*a* gradually becomes wider as it goes toward the pad moving direction. This forms a structure that leads the resist solution. R scraped away with the V-shaped edge 49*d*1 on the pad rear side acting as a scraping edge into the V-shaped groove 49*a* (lead-out passage) and drains it from the pad front side (V-shaped edge 49*b*1 side).

Note that in the first embodiment of the wiping pad 49 illustrated in FIG. 6 to FIG. 9, an inclination angle θ1 of the inclined surface 49*d* with respect to the rear surface 49*c* (vertical surface) is 45° and an inclination angle θ2 of each of the inclined surfaces 49*a*1, 49*a*2 of the V-shaped groove 49*a* with respect to the inclined surface 49*d* is 90° or more (for example, 98.794°) as illustrated in FIG. 8, FIG. 9.

The inclination angles θ1, θ2 are set as described above so as to make it possible to bring the V-shaped edge 49*d*1 of the wiping pad 49 in the standing posture into contact with the discharge port 32*a* and the nozzle side surfaces 32*f*, 32*r*. Further, setting the inclination angle θ2 makes a shape in which the groove width and depth of the V-shaped groove 49*a* gradually increase toward the pad moving direction, and can thereby form the lead-out passage for the resist solution R in front of the V-shaped edge 49*d*1 (as the scraping edge).

Subsequently, a series of operations from the application of the resist solution by the resist coating apparatus 1 to the maintenance of the nozzle 32 will be described.

First, the substrate G is transferred from a unit at the previous stage into a transfer-in area set at the front end side of the floating stage 10, and the sliders 24 waiting there receive the substrate G. The substrate G receives the pressure of the gas jetted from the gas jetting ports 12 above the floating stage 10 and kept in a floating state in a substantially horizontal posture.

On the other hand, the whole waiting unit 42 is moved to below the nozzle so that the position in the X-direction of the nozzle 32 is aligned with the position of the swipe part 48, and the nozzle 32 is moved to lower by the nozzle raising and lowering mechanism 26.

Figure 10:
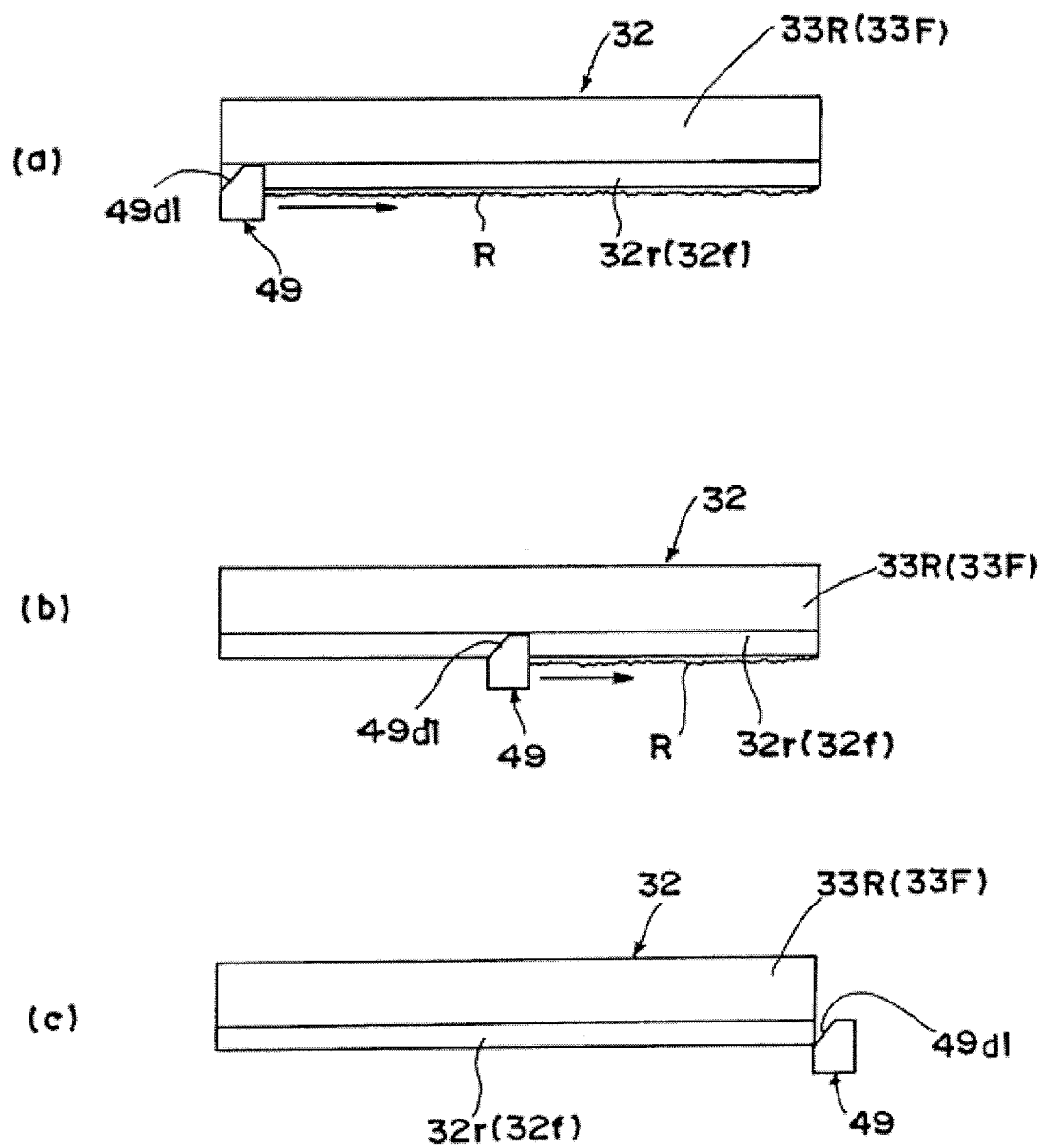
FIG. 10(a) to FIG. 10(c) are front views of the nozzle illustrating the states of a nozzle tip scanned by the wiping pad in FIG. 6 in chronological order.

Here, the wiping pad 49 is brought into a state that its V-shaped groove 49*a* engages with the discharge port 32*a* and the nozzle side surfaces 32*f*, 32*r* on one end side of the nozzle 32 as illustrated in FIG. 10(*a*). In this event, the discharge port 32*a* and the nozzle side surfaces 32*f*, 32*r* are brought into a state that only the V-shaped edge 49*d*1 (scraping edge) of the wiping pad 49 is in contact with them.

Subsequently, the Y-direction moving part 60 operates to move (scan) the wiping pad 49 at a predetermined speed to the nozzle other end side as sequentially illustrated in FIG. 10(*b*), FIG. 10(*c*). In the movement, the resist solution R at the nozzle tip (the discharge port 32*a* and the nozzle side surfaces 32*f*, 32*r*) is scraped away with the NT-shaped edge 49*d*1 on the pad rear side and led out into the V-shaped groove 49*a*, and drained from the V-shaped edge 49*b*1 side on the pad front side. This wipes out the excessive resist solution R adhering to the discharge port 32*a* and the nozzle side surfaces 32*f*, 32*r*.

After the wiping of the resist solution R at the nozzle tip is completed in the swipe part 48, the nozzle 32 is moved to rise by the nozzle raising and lowering mechanism 26, and the waiting unit 42 is moved from the position directly below the nozzle 32 to a position on the upstream in the substrate transfer direction.

Then, the nozzle 32 is lowered by the nozzle raising and lowering mechanism 26 and the discharge port 32*a* is kept at a predetermined height with respect to the floating stage 10.

Then, the substrate G is moved by the substrate transfer mechanism 20 at a fixed speed in the transfer direction (X-direction) in a horizontal posture, and the resist solution is discharged in a band shape at a predetermined pressure or flow rate from the nozzle 32 onto the substrate G.

This forms a coating film of the resist solution R with a uniform film thickness from the front end side to the rear end side of the substrate G as illustrated in FIG. 2, FIG. 3. When the rear end of the substrate G passes under the nozzle 32, a resist coating film is formed on the entire substrate surface, with which the coating treatment ends.

The substrate G on which the resist coating film has been formed is further transferred by the sliders 24 while floating above the floating stage 10 and transferred out of a transfer-out area set at the rear side of the floating stage 10 to a unit at the subsequent stage.

On the other hand, the nozzle 32 after finishing the coating treatment is moved to rise by the nozzle raising and lowering mechanism 26, and the waiting unit 42 is moved a predetermined distance to the downstream side in the substrate transfer direction so that the nozzle bath 50 is arranged directly below the nozzle 32. Then, the nozzle 32 is moved to lower again by the nozzle raising and lowering mechanism 26 so that the nozzle tip is held in the nozzle bath 50 and the discharge port 32a is prevented from drying up, and waits for the coating treatment for the next substrate G.

According to the embodiment of the present invention, a step of bringing the V-shaped edge 49d1 of the wiping pad 49 crossing the nozzle long side direction into contact with the nozzle tip and scanning it in the nozzle long side direction is performed in the swipe part 48 before the coating treatment of the resist solution R to the substrate G. Here, since the V-shaped groove 49a for draining the resist solution R which has been scraped away with the V-shaped edge 49d1 is provided ahead of the V-shaped edge 49d1 in the moving direction of the wiping pad 49, the scraped resist solution R can be effectively scraped away without escaping to the rear of the (moving) wiping pad 49.

As a result, it becomes unnecessary to provide the priming roller as in the prior art and unnecessary to discharge the resist solution to a roller surface for the priming treatment, thereby reducing the consumption of the resist solution R.

Further, as compared with the conventional priming treatment using the priming roller, the time required for the maintenance treatment of the nozzle tip can be greatly reduced and the tact time is thus reduced, thereby improving productivity. Furthermore, since the priming roller is unnecessary, the cleaning solution used for cleaning the roller also becomes unnecessary, thereby making it possible to significantly reduce the cost.

Note that in the above embodiment, in the first embodiment of the wiping pad 49 illustrated in FIG. 6 to FIG. 9, the inclination angle θ1 of the inclined surface 49d with respect to the rear surface 49c is 45° and the inclination angle θ2 of each of the inclined surfaces 49a1, 49a2 of the V-shaped groove 49a with respect to the inclined surface 49d is 98.794° as illustrated in FIG. 8, FIG. 9.

However, in the maintenance apparatus according to the present invention, the values of the inclination angles θ1, θ2 are not limited, but combinations of various angles can be employed. Hereinafter, second to fourth embodiments of the wiping pad 49 will be described as concrete examples.

Figure 11:
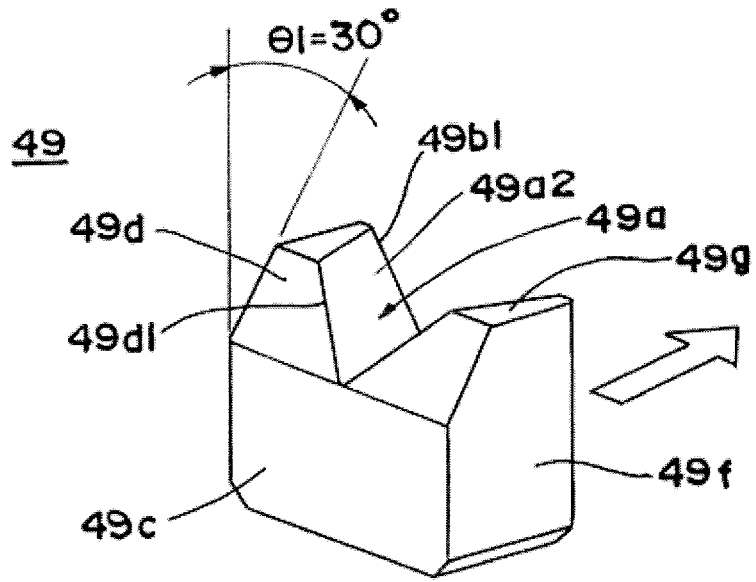
FIG. 11 is a view illustrating a second embodiment of the wiping pad included in the swipe part in FIG. 5, and a perspective view as viewed from the front side in its moving direction.
Figure 12:
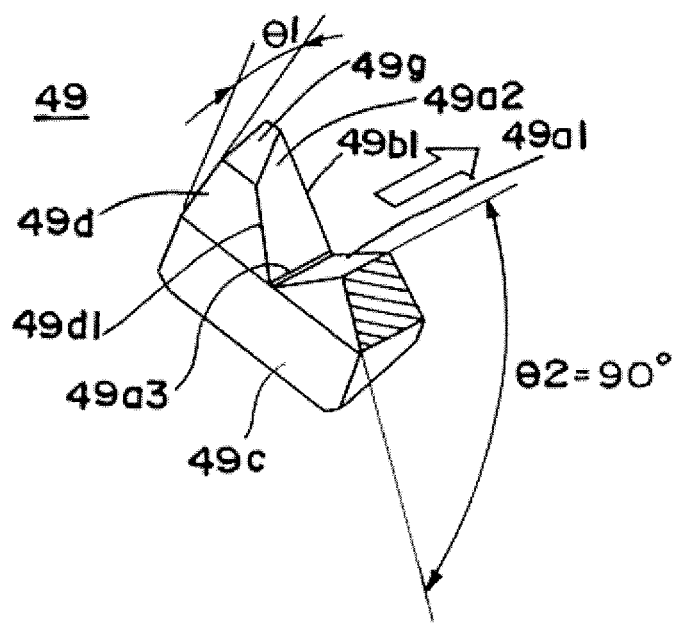
FIG. 12 is a perspective view of the wiping pad in FIG. 11 with its partial cross-section.

FIG. 11, FIG. 12 illustrate a second embodiment of the wiping pad 49, FIG. 11 is a perspective view of the wiping pad 49 as viewed from the rear side in the moving direction, and FIG. 12 is a perspective view of the wiping pad 49 with its partial cross-section. Note that arrows illustrated in FIG. 11, FIG. 12 indicate the moving direction of the wiping pad 49 by the Y-direction moving part 60.

In the wiping pad 49 illustrated in FIG. 11, FIG. 12, the inclination angle θ1 of the inclined surface 49d with respect to the rear surface 49c (vertical surface) is 30° and the inclination angle θ2 of each of the inclined surfaces 49a1, 49a2 of the V-shaped groove 49a with respect to the inclined surface 49d is 90°.

Even setting the inclination angles θ1, θ2 as described above makes it possible to bring the V-shaped edge 49d1 of the wiping pad 49 in the standing posture into contact with the discharge port 32a and the nozzle side surfaces 32f, 32r. Further, the groove width and depth of the V-shaped groove 49a gradually increase toward the moving direction of the wiping pad 49, thus making it possible to lead out the resist solution R which has been scraped away with the V-shaped edge 49d1 into the V-shaped groove 49a (lead-out passage) and effectively drain it from the V-shaped edge 49b1 side ahead thereof.

Figure 13:
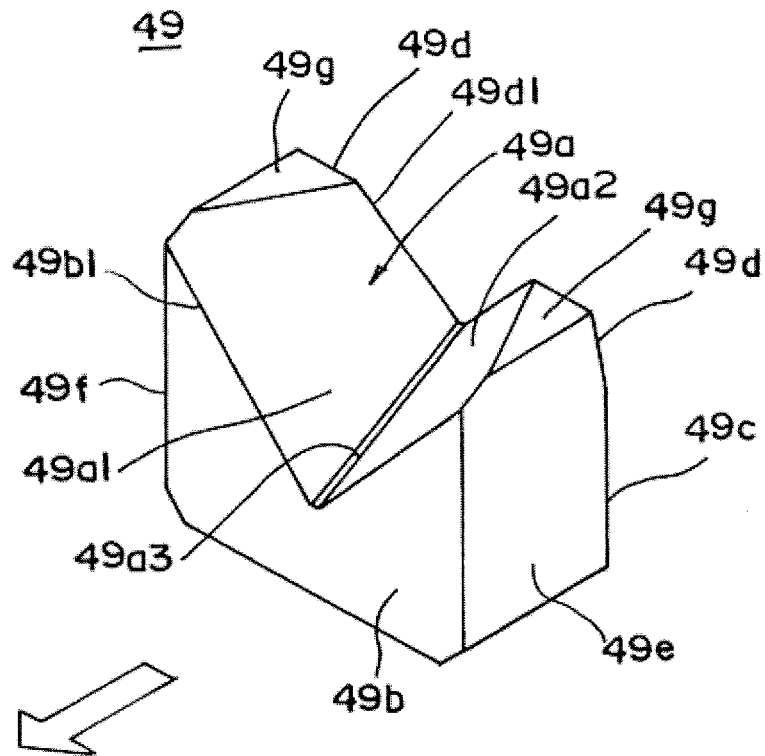
FIG. 13 is a view illustrating a third embodiment of the wiping pad included in the swipe part in FIG. 5, and a perspective view as viewed from the front side in its moving direction.
Figure 14:
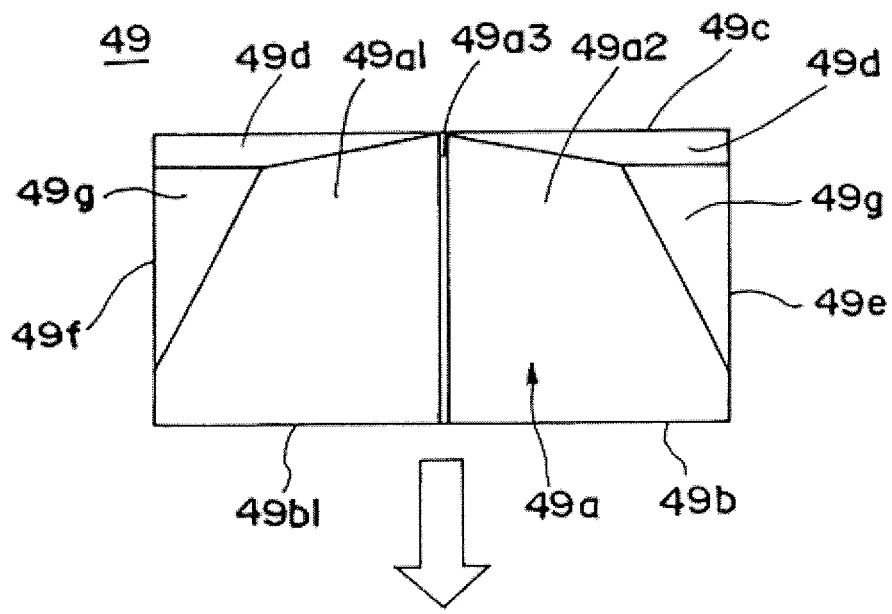
FIG. 14 is a plan view of the wiping pad in FIG. 11
Figure 15:
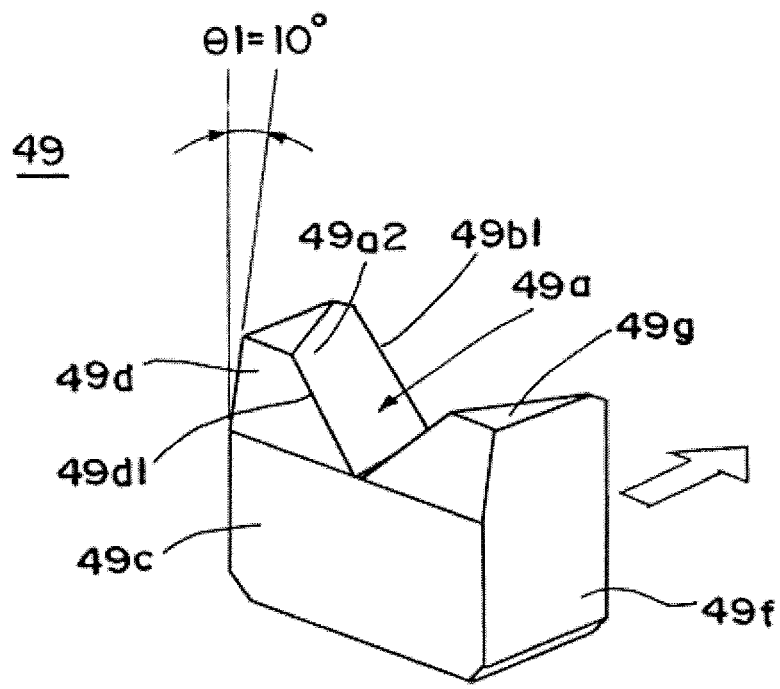
FIG. 15 is a perspective view of the wiping pad in FIG. 13 as viewed from the rear side in its moving direction.
Figure 16:
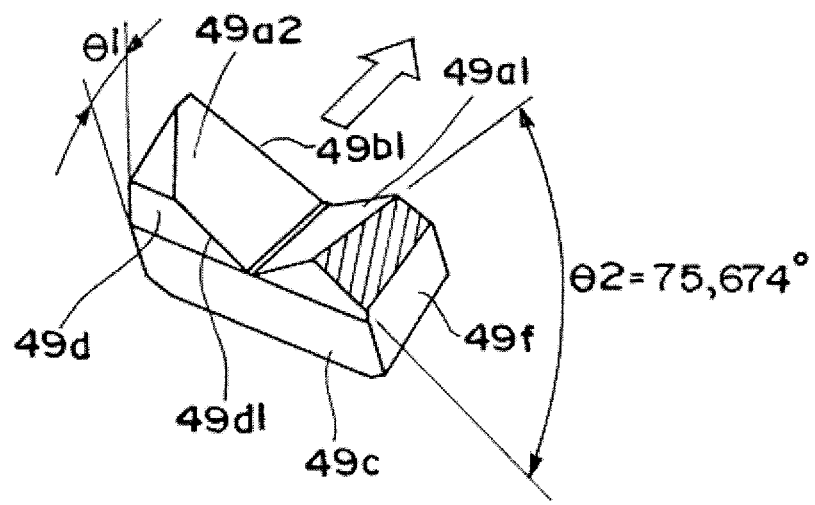
FIG. 16 is a perspective view of the wiping pad in FIG. 13 with its partial cross-section.

FIG. 13 to FIG. 16 illustrate a third embodiment of the wiping pad 49, FIG. 13 is a perspective view of the wiping pad 49 as viewed from the front side in the moving direction, and FIG. 14 is a plan view. Further, FIG. 15 is a perspective view of the wiping pad 49 as viewed from the rear side in the moving direction, and FIG. 16 is a perspective view of the wiping pad 49 with its partial cross-section. Note that arrows illustrated in FIG. 13 to FIG. 16 indicate the moving direction of the wiping pad 49 by the Y-direction moving part 60.

In the third embodiment of the wiping pad 49, as illustrated in FIG. 15, FIG. 16, the inclination angle θ1 of the inclined surface 49d with respect to the rear surface 49c is 10° and the inclination angle θ2 of each of the inclined surfaces 49a1, 49a2 of the V-shaped groove 49a with respect to the inclined surface 49d is 75.674°.

Even setting the inclination angles θ1, θ2 as described above makes it possible to bring the V-shaped edge 49d1 of the wiping pad 49 in the standing posture into contact with the discharge port 32a and the nozzle side surfaces 32f, 32r. Further, in the case of this shape, the groove width of the V-shaped groove 49a is wider than that in the case of the shape in FIG. 6 to FIG. 9 and the groove width and depth of the V-shaped groove 49a gradually increase toward the moving direction of the wiping pad 49 as illustrated in FIG. 14, thus making it possible to lead out a larger amount of the resist solution R into the V-shaped groove 49a (lead-out passage) and drain it from the V-shaped edge 49b1 side ahead thereof.

Figure 17:
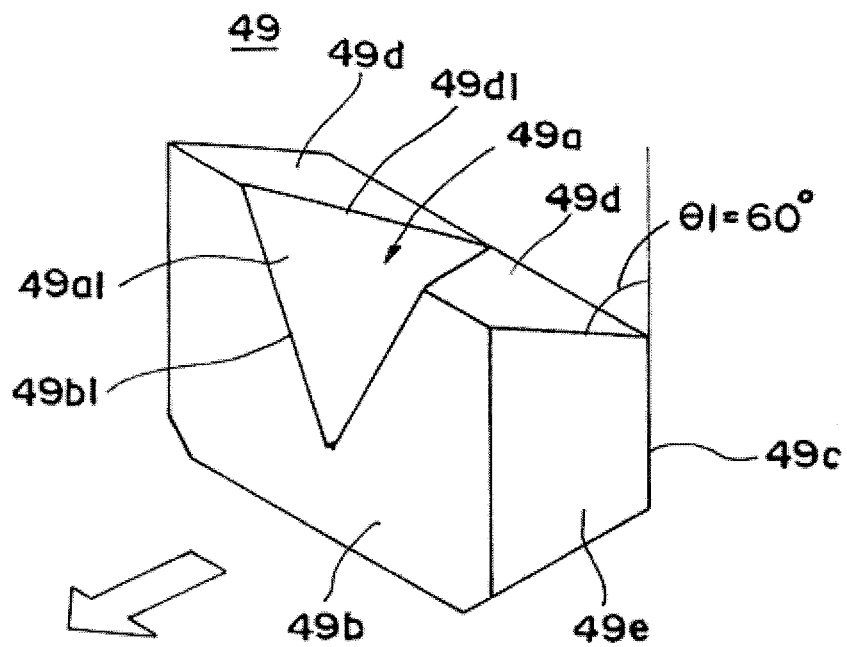
FIG. 17 is a view illustrating a fourth embodiment of the wiping pad included in the swipe part in FIG. 5, and a perspective view as viewed from the front side in its moving direction.
Figure 18:
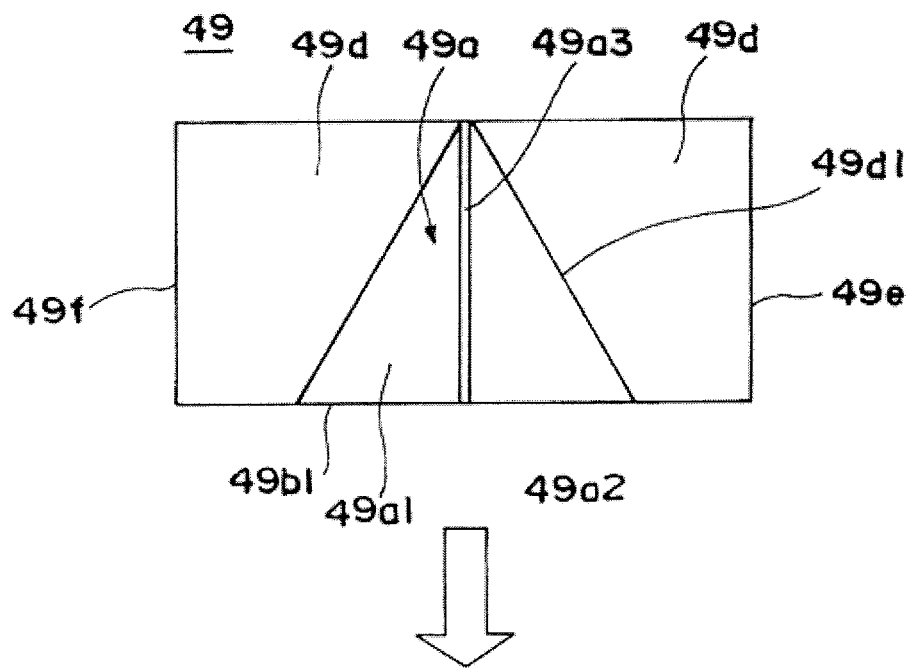
FIG. 18 is a plan view of the wiping pad in FIG. 17.
Figure 19:
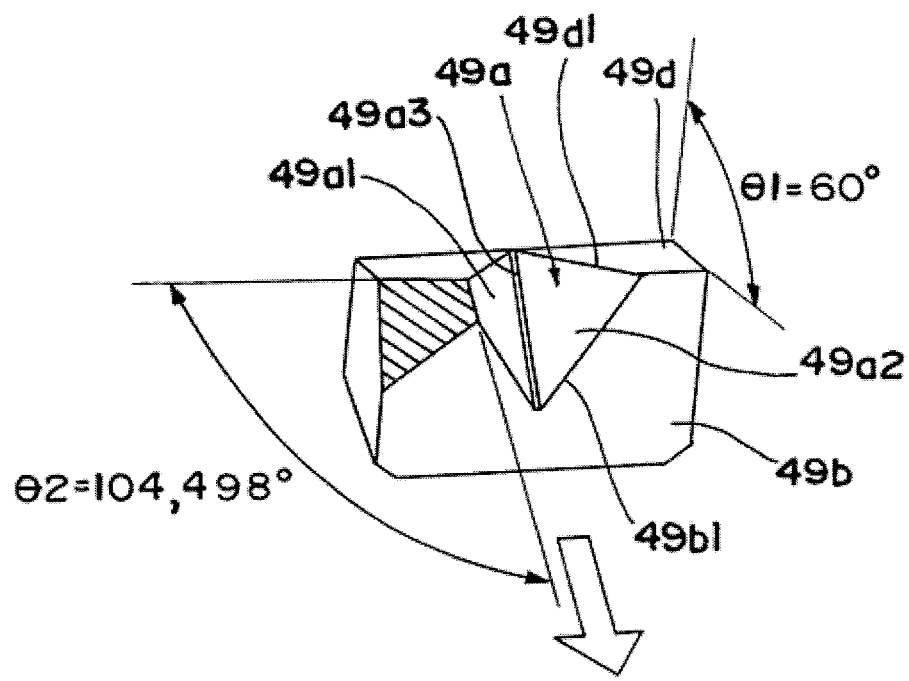
FIG. 19 is a perspective view of the wiping pad in FIG. 17 with its partial cross-section.

FIG. 17 to FIG. 19 illustrate a fourth embodiment of the wiping pad 49, FIG. 17 is a perspective view of the wiping pad 49 as viewed from the front side in the moving direction, and FIG. 18 is a plan views, Further, FIG. 19 is a perspective view of the wiping pad 49 with its partial cross-section. Note that arrows illustrated in FIG. 17 to FIG. 19 indicate the moving direction of the wiping pad 49 by the Y-direction moving part 60.

In the fourth embodiment of the wiping pad 49, as illustrated in FIG. 17, FIG. 19, the inclination angle θ1 of the inclined surface 49d with respect to the rear surface 49c (vertical surface) is made large to be 60° and the inclination angle θ2 of each of the inclined surfaces 49a1, 49a2 of the V-shaped groove 49a with respect to the inclined surface 49d is 104.498°.

Even setting the inclination angles θ1, θ2 as described above makes it possible to bring the V-shaped edge 49d1 of the wiping pad 49 in the standing posture into contact with the discharge port 32a and the nozzle side surfaces 32f, 32r. Further, in the shape, the upper end side of the V-shaped edge 49d1 in contact with the nozzle 32 reaches the front surface 49b as illustrated in FIG. 18 so that the groove width of the V-shaped groove 49a extends in a fan shape toward the moving direction of the pad 49. This makes it possible to lead out the resist solution R which has been scraped away with the V-shaped edge 49d1 into the V-shaped groove 49a (lead-out passage) and instantaneously drain it from the V-shaped edge 49b1 side ahead thereof.

Further, in the above described first to fourth embodiments of the wiping pad, the resist solution R which has been scraped away with the V-shaped edge 49d1 is drained to the V-shaped groove 49a formed on the upper surface side of the wiping pad 49 as the lead-out passage, but the lead-out passage is not limited to the upper surface side.

Figure 20:
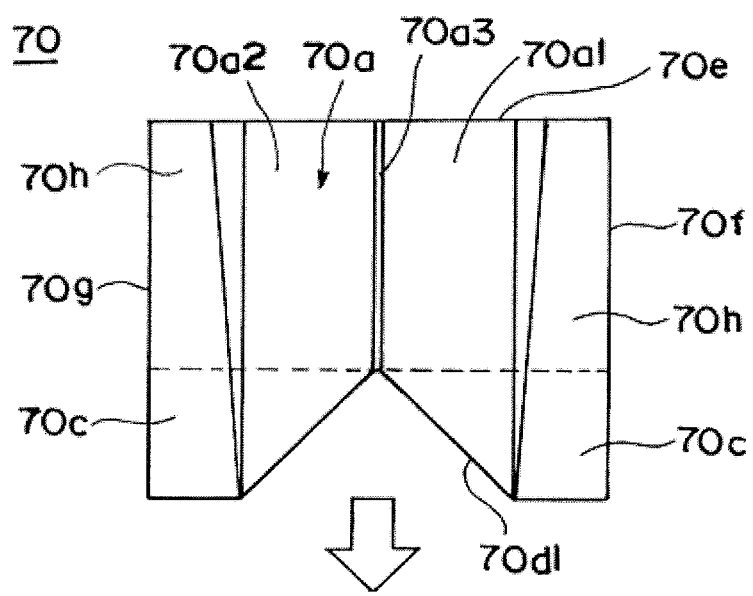
FIG. 20 is a plan view illustrating a fifth embodiment of the wiping pad included in the swipe part in FIG. 5.
Figure 21:
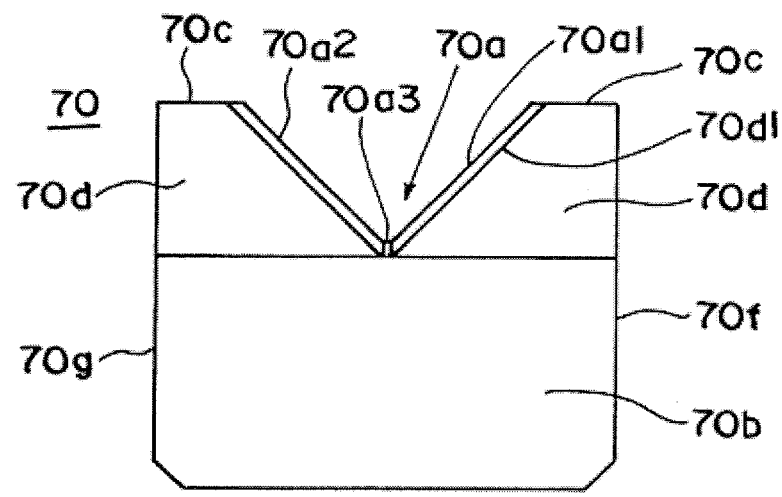
FIG. 21 is a front view of the wiping pad in FIG. 20.
Figure 22:
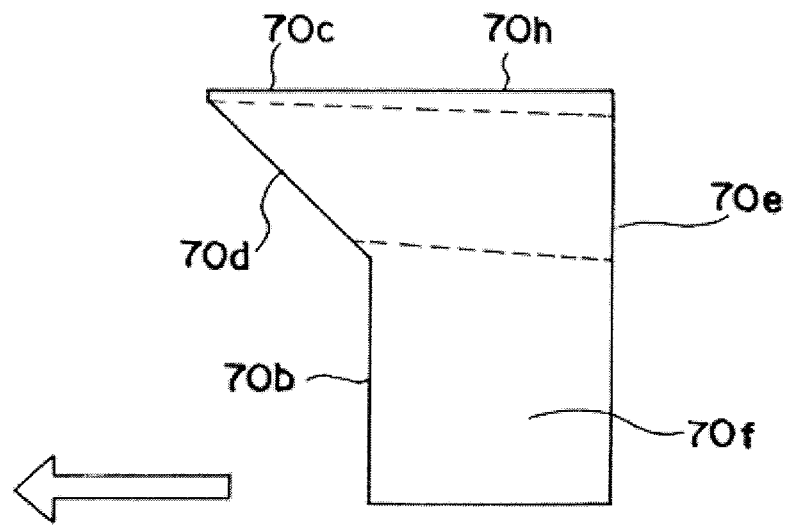
FIG. 22 is a side view of the wiping pad in FIG. 20.

As a concrete example, a fifth embodiment of the wiping pad is illustrated in FIG. 20 to FIG. 22. In the wiping pad according to the fifth embodiment is greatly different in shape from those in the first to fourth embodiments, and therefore a wiping pad 70 is used in place of the wiping pad 49, and its shape will be described below.

FIG. 20 is a plan view of the wiping pad 70, FIG. 21 is a front view as viewed from the front side in the moving direction, and FIG. 22 is a side view. Note that arrows illustrated in FIG. 20, FIG. 22 indicate the moving direction of the wiping pad 70 by the Y-direction moving part 60.

As illustrated, the wiping pad 70 has a V-shaped groove 70a formed in a groove shape along the pad moving direction on its upper surface side, and the V-shaped groove 70a corresponds to the shapes of the discharge port 32a and the nozzle side surfaces 32f, 32r of the nozzle 32. More specifically, in the V-shaped groove 70a, inclined surfaces 70a1, 70a2 opposing in a substantially V-shape are formed, and a bottom part 70a3 with a predetermined length is linearly formed along the pad moving direction (Y-direction) at the lower end portion between them.

Further, the wiping pad 70 has a front surface 70b formed on the front side in the pad moving direction indicated with the arrow, and a flange part 70c projecting forward formed at an upper portion thereof. Further, the wiping pad 70 has a rear surface 70e formed on the rear side in the moving direction, side surfaces 70f, 70g formed on both left and right sides respectively, and an upper surface 70h formed on the upper side. The flange part 70c has an upper surface projecting in flash with the upper surface 70h, and an inclined surface 70d formed on the lower surface side.

Further, since the V-shaped groove 70a is provided to the flange part 70c side, the flange part 70c has an edge in a V-shape (called a V-shaped edge) 70d1 formed as a scraping edge in a front view as illustrated in FIG. 21, is and the V-shaped edge 70d1 is in a V-shape widening from the middle to both right and left sides toward a front in a plan view as illustrated in FIG. 20. Namely, only the V-shaped edge 70d1 on the pad front side comes into contact with the discharge port 32a and the nozzle side surfaces 32f, 32r of the nozzle 32.

Note that a height (thickness) dimension of the flange part 70c is made to be equal to the depth dimension of the front edge portion of the V-shaped groove 70a. Further, in this configuration, the inclined surface 70d being the lower surface of the flange part 70c and the front surface 70b function as the lead-out passage for the resist solution.

In the wiping operation of the nozzle tip by the wiping pad 70 configured as described above, the resist solution R scraped away with the V-shaped edge 70d1 is led out from the inclined surface 70d on the lower surface side of the flange part 70c to the front surface 70b and drained downward.

In short, the configuration of the wiping pad can also achieve the object of the present invention.

Further, in the first to fifth embodiments of the above-described wiping pad, the wiping pad 49 (70) is formed in a shape to wipe away all the resist solution R adhering to the nozzle tip. However, in the maintenance apparatus according to the present invention, the shape of the wiping pad 49 (70) is not limited to the above, but can be formed in a shape of intentionally leaving the resist solution R in a bead line shape at a specific portion of the nozzle.

In this case, the portion where the resist solution R is left has wettability, so that the flow of the resist solution R is easily guided toward the direction in the discharge of the resist solution to the next substrate G thereby suppressing coating mottles.

Figure 23:
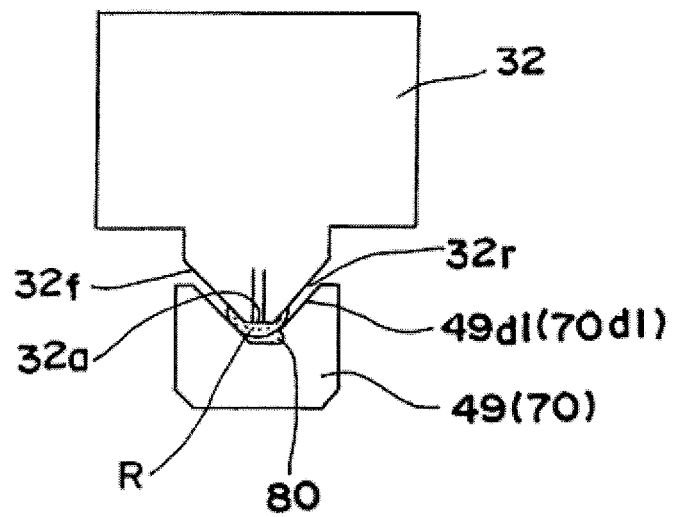
FIG. 23 is a front view illustrating a sixth embodiment of the wiping pad included in the swipe part in FIG. 5 and a side view of the nozzle.

Concretely explaining, FIG. 23 is a front view illustrating a sixth embodiment of the wiping pad and a side view of the nozzle 32. The wiping pad 49 (70) illustrated in FIG. 23 is provided with a cutout part 80 having predetermined width and depth at a part of the V-shaped edge 49d1 (70d1) in contact with the nozzle tip. Specifically, the cutout part 80 is provided at a portion corresponding to the rear side of the discharge port 32a.

Figure 24:
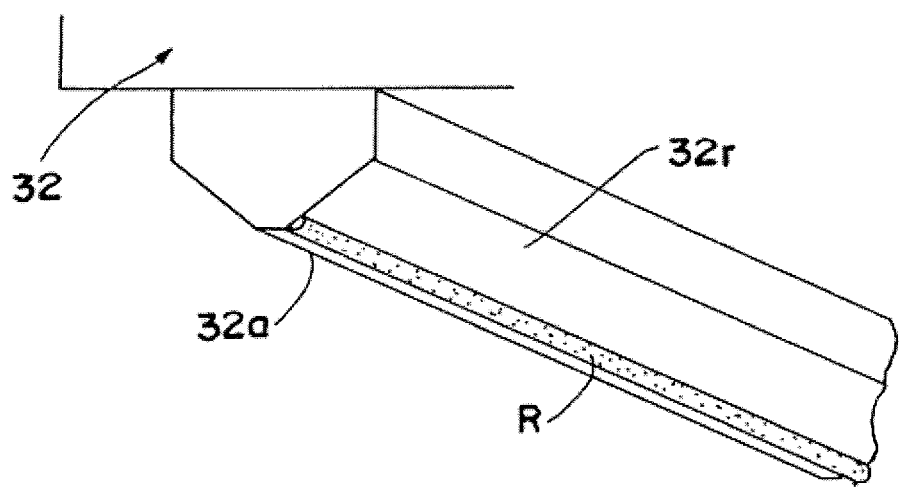
FIG. 24 is a perspective view of the nozzle illustrating the state after the nozzle tip is wiped with the wiping pad in FIG. 23.

This makes the resist solution R in a bead line shape adhere only on the rear side of the discharge port 32a as illustrated in FIG. 24 when the nozzle tip is scanned using the wiping pad 49 (70).

Figure 25:
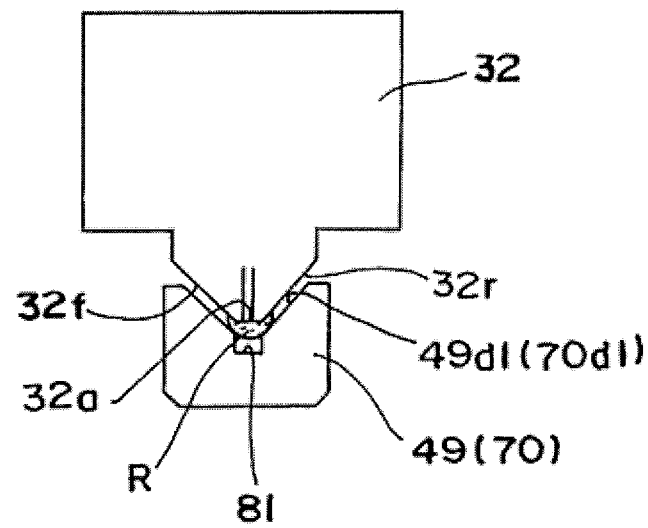
FIG. 25 is a front view illustrating a seventh embodiment of the wiping pad included in the swipe part in FIG. 5 and a side view of the nozzle.

Further, FIG. 25 is a front view illustrating a seventh embodiment of the wiping pad and a side view of the nozzle 32. The wiping pad 49 (70) illustrated in FIG. 25 is provided with a cutout part 81 having a predetermined depth at a portion, corresponding to the discharge port 32a, of the V-shaped edge 49d1 (70d1) in contact with the nozzle tip.

Figure 26:
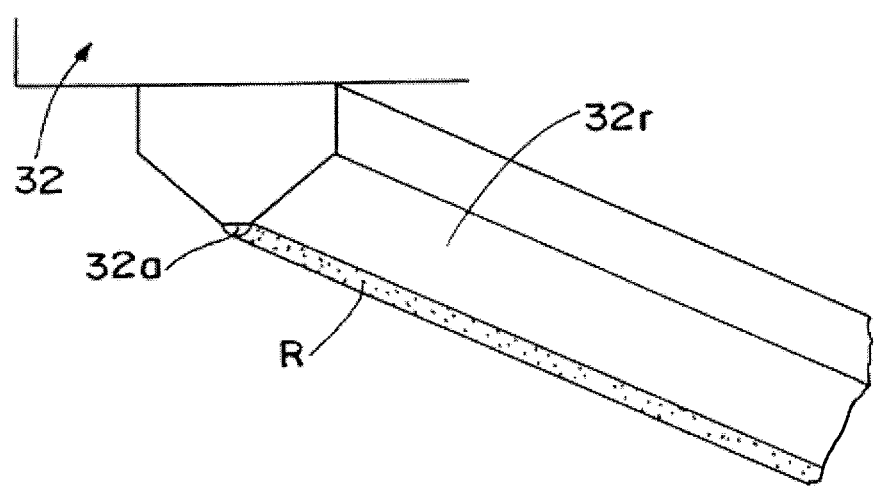
FIG. 26 is a perspective view of the nozzle illustrating the state after the nozzle tip is wiped with the wiping pad in FIG. 25.

This makes the resist solution R in a bead line shape adhere only on the discharge port 32a as illustrated in FIG. 26 when the nozzle tip is scanned using the wiping pad 49 (70).

Figure 27:
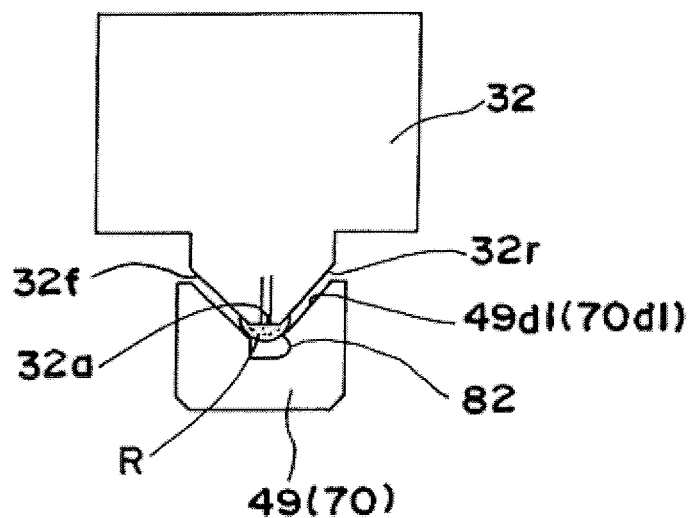
FIG. 27 is a front view illustrating an eighth embodiment of the wiping pad included in the swipe part in FIG. 5 and a side view of the nozzle.

Further, FIG. 27 is a front view illustrating an eighth embodiment of the wiping pad and a side view of the nozzle 32. The wiping pad 49 (70) illustrated in FIG. 27 is provided with a cutout part 82 having predetermined width and depth at a portion, corresponding to the discharge port 32a and its rear side, of the V-shaped edge 49d1 (70d1) in contact with the nozzle tip.

Figure 28:
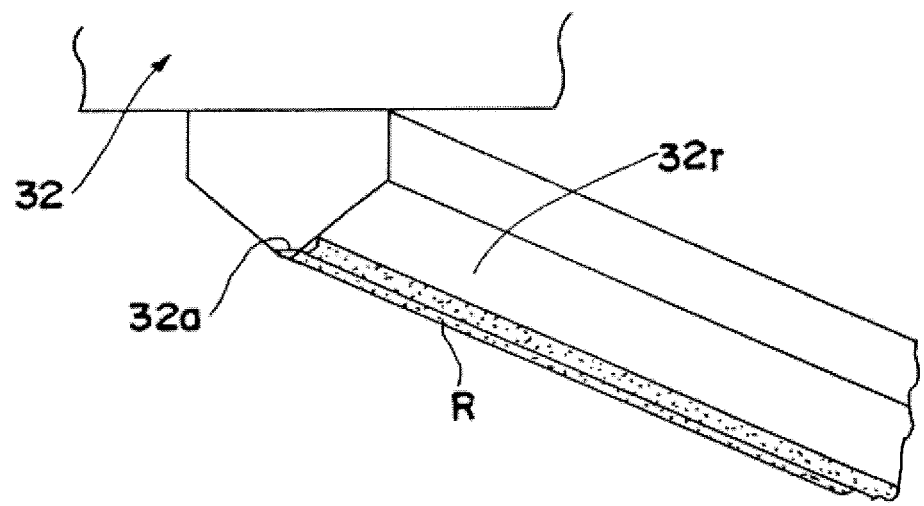
FIG. 28 is a perspective view of the nozzle illustrating the state after the nozzle tip is wiped with the wiping pad in FIG. 27.
Figure 29:
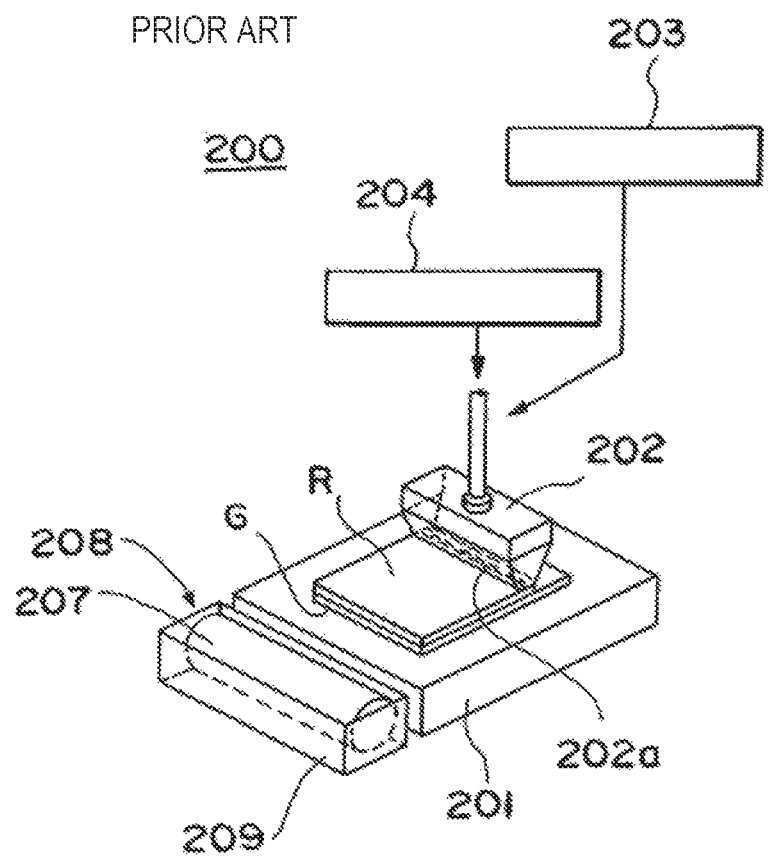
FIG. 29 is a perspective view of a conventional resist coating apparatus.
Figure 30:
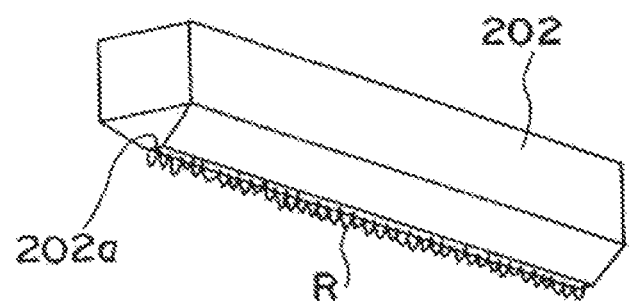
FIG. 30 is a perspective view of the nozzle illustrating the state of the nozzle tip when the priming treatment is not performed for the nozzle tip.

This makes the resist solution R in a bead line shape adhere only on the discharge port 32a and its rear side as illustrated in FIG. 28 when the nozzle tip is scanned using the wiping pad 49 (70).

Further, the case where the wiping pad 49 (70) is scanned in one direction from one end to the other end of the nozzle 32 has been described as an example in the above embodiments, and the wiping pad 49 (70) is not limited to that but may be reversed in direction after finish of the scan in the one direction and further scanned in the opposite direction. Alternatively, two (plural) swipe parts 48 that are scanned in directions opposite to each other may be provided to scan the wiping pad 49 (70) from both directions in sequence along the long side direction of the nozzle 32.

Further, in the above embodiments, the nozzle 32 is configured to be moved to lower so as to bring the nozzle tip into contact with (press against) the V-shaped edge 4941 (70d1) of the wiping pad 49 (70) but is not limited to this. For example, a mechanism that vertically moves the swipe part 48 is provided to raise the wiping pad 49 (70) with respect to the nozzle tip to bring the V-shaped edge 49d1 (70d1) into contact therewith.

Further, the wiping pad 49 (70) is merely held on the carriage 64 as illustrated in FIG. 5 in the above embodiments, but may be held on the carriage 64 via a resilient member (such as a spring member) so that the V-shaped side 49d1 (70d1) of the wiping pad 49 (70) is pressed against the nozzle tip utilizing its resilient force.

Further, the inclination angles θ1, θ2 of the wiping pad 49 are set so that the V-shaped edge 49d1 of the wiping pad 49 in the standing posture comes into contact with the discharge port 32a and the nozzle side surfaces 32f, 32r in the above embodiments, but the present invention is not limited to the configuration.

For example, since the wiping pad 49 has flexibility, the widening angle of the V-shaped edge 49d1 may be formed to be wider (or narrower) than the angles in the embodiments and the V-shaped edge 49d1 may be brought into contact with the discharge port 32a and the nozzle side surfaces 32f, 32r by pressing the nozzle 32 against the wiping par 49 (or pressing the wiping par 49 against the nozzle 32).

Further, the substrate G is transferred by the substrate transfer mechanism 20 (relative moving means) with respect to the nozzle 32 fixed in the substrate transfer direction (X-direction) so that the nozzle 32 and the substrate G are relatively moved in the above embodiments, but the present invention is not limited to the configuration.

For example, the substrate G may be fixed in the substrate transfer direction and the nozzle 32 may be moved (by a not-illustrated moving mechanism in the X-direction) to scan from one end to the other end of the substrate G.

Alternatively, with respect to the substrate G transferred in the X-direction, the nozzle 32 may be moved (by a not-illustrated moving mechanism in the X-direction) in the opposite direction so that they are relatively moved.

Figure 31:
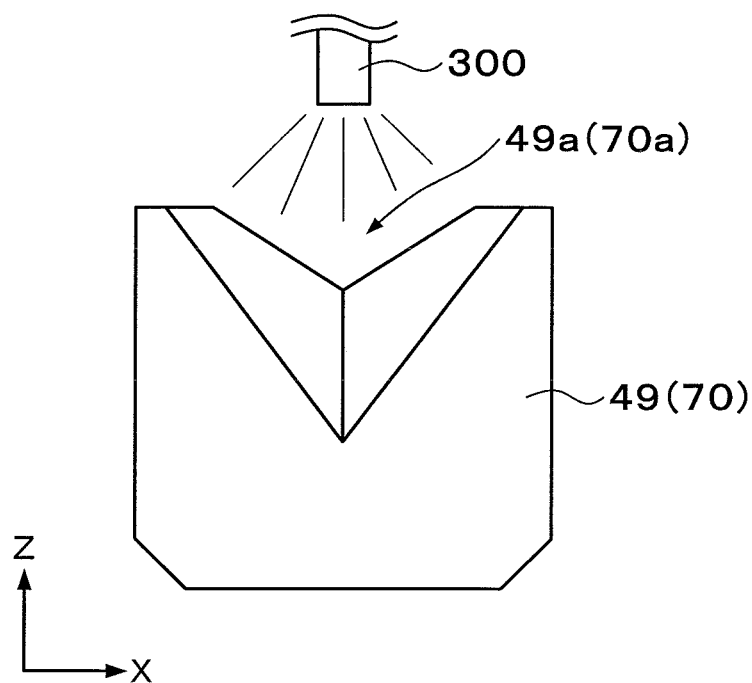
FIG. 31 is a front view illustrating the appearance that a cleaning solution nozzle is provided at a waiting unit.

Furthermore, a cleaning solution nozzle 300 that supplies a cleaning solution toward the V-shaped groove 49a (70a) may be provided as illustrated in FIG. 31 in the waiting unit 42. Before the wiping pad 49 (70) wipes the nozzle 32, the cleaning solution is supplied from the cleaning solution nozzle 300 toward the V-shaped groove 49a (70a). Then, with the V-shaped edge 49d1 (70d1) and the V-shaped groove 49a (70a) wetted with the cleaning solution, the wiping operation of the nozzle 32 is performed. This makes it possible to wipe the nozzle 32 further clean. Further, the dirt of the wiping pad 49 (70) can also be reduced.

Figure 32:
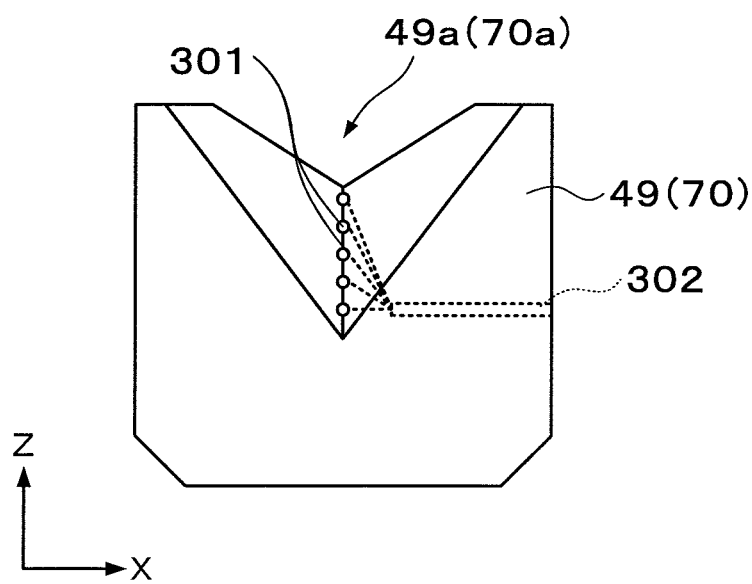
FIG. 32 is a front view illustrating the appearance that cleaning solution supply ports are provided at the wiping pad.

Note that as illustrated in FIG. 32, the wiping pad 49 (70) may be provided with cleaning solution supply ports 301 in place of the cleaning solution nozzle 300. The cleaning solution supply ports 301 are arranged at the bottom part 49a3 (70a3) of the V-shaped groove 49a (70a). Further, a cleaning solution supply passage 302 communicating with the cleaning solution supply ports 301 is provided inside the wiping pad 49 (70). Before the wiping pad 49 (70) wipes the nozzle 32, the cleaning solution is supplied from the cleaning solution supply ports 301 toward the V-shaped edge 49d1 (70d1) and the V-shaped groove 49a (70a). With the V-shaped edge 49d1 (70d1) and the V-shaped groove 49a (70a) wetted with the cleaning solution, the wiping operation of the nozzle 32 is performed. Note that the positions of the cleaning solution supply ports 301 are not limited to the above-described bottom part 49a3 (70a3) of the V-shaped groove 49a (70a). For example, the cleaning solution supply ports 301 may be arranged near the upper end portion of the V-shaped groove 49a (70a).

EXPLANATION OF CODES 1 resist coating apparatus (coating treatment apparatus)
20 substrate transfer mechanism (relative moving means)
32 nozzle
32a discharge port
32f nozzle side surface
32r nozzle side surface
42 waiting unit (nozzle maintenance apparatus)
48 swipe part
49 wiping pad
49a V-shaped groove (lead-out passage)
49a1 inclined surface
49a2 inclined surface
49a3 bottom part
49b front surface
49c rear surface
49d inclined surface
49d1 V-shaped edge (scraping edge)
49e side surface
49f side surface
49g upper surface
50 nozzle bath
60 Y-direction moving part (pad moving means)
70 wiping pad
70b front surface (lead-out passage)
70d1 V-shaped edge (scraping edge)
70c flange part
70d inclined surface (lead-out passage)
80 cutout part
81 cutout part
82 cutout part
300 cleaning solution nozzle
301 cleaning solution supply port
G substrate (substrate to be treated)
R resist solution (treatment solution)

What is claimed:

1. A wiping pad moved from One end side to another end side in a nozzle long side direction for wiping away a treatment solution adhering to a discharge port and nozzle side surfaces of a nozzle, the nozzle having the discharge port in a slit shape long in a width direction of a substrate to be treated and the nozzle side surfaces extending in parallel with the discharge port on both front and rear sides of the discharge port and formed in a tapered shape gradually getting thinner from a top to a bottom toward the discharge port, the wiping pad comprising:
a front surface formed on a moving direction side;
a rear surface formed on a moving direction rear side;
inclined surfaces formed on an upper end of the rear surface on the moving direction rear side and inclined toward the moving direction side;
upper surfaces formed on an upper side of the front surface and an upper side of the inclined surfaces;
side surfaces formed on both left and right sides of the front surface, the rear surface, and the inclined surfaces; and
a V-shaped groove formed along the moving direction on a pad upper surface side by opposing inclined surfaces, the V-shaped groove further comprising:
a scraping edge formed on the inclined surfaces inclined toward the moving direction side by a rear end edge portion of the V-shaped groove and provided to cross a long side direction of the discharge port and come into contact with the discharge port and the nozzle side surfaces; and
a lead-out passage composed of the V-shaped groove, the lead-out passage is provided ahead of the scraping edge in a moving direction along the nozzle long side direction to drain the treatment solution scraped away with the scraping edge,
wherein the V-shaped groove is formed to gradually increase in groove width and depth toward a front thereof from the scraping edge, and
wherein inclination angles of the inclined surfaces of the V-shaped groove with respect to the inclined surfaces inclined toward the moving direction side are formed to be 90° or more respectively.

2. A wiping pad moved from one end side to another end side in a nozzle long side direction for wiping away a treatment solution adhering to a discharge port and nozzle side surfaces of a nozzle, the nozzle having the discharge port in a slit shape long in a width direction of a substrate to be treated and the nozzle side surfaces extending in parallel with the discharge port on both front and rear sides of the discharge port and formed in a tapered shape gradually getting thinner from a top to a bottom toward the discharge port, the wiping pad comprising:
a scraping edge provided to cross a long side direction of the discharge port and come into contact with the discharge port and the nozzle side surfaces, and a lead-out passage provided ahead of the scraping edge in a moving direction along the nozzle long side direction to drain the treatment solution scraped away with the scraping edge, wherein the scraping edge is formed in a V-shape in a front view at an upper portion of a pad front surface in the moving direction, and provided with a flange part projecting forward on both right and left sides of the scraping edge and thereby formed in a V-shape widening from a middle to both right and left sides toward a front in a plan view, and wherein the lead-out passage is formed of a pad front surface side including a lower surface of the flange part.

3. The wiping pad according to claim 1,
wherein a cutout part having predetermined width and depth is provided at a predetermined portion of the scraping edge.

4. The wiping pad according to claim 2,
wherein a cutout part having predetermined width and depth is provided at a predetermined portion of the scraping edge.

5. The wiping pad according to claim 1,
wherein a supply port configured to supply a cleaning solution to the scraping edge and the V-shaped groove is provided at the V-shaped groove.

6. A nozzle maintenance apparatus for wiping away a treatment solution adhering to a discharge port and nozzle side surfaces of a nozzle, the nozzle having the discharge port in a slit shape long in a width direction of a substrate to be treated and the nozzle side surfaces extending in parallel with the discharge port on both front and rear sides of the discharge port and formed in a tapered shape gradually getting thinner from a top to a bottom toward the discharge port, the nozzle maintenance apparatus comprising:
a wiping pad; and
a pad moving mechanism which include a carriage combined with a Y-direction moving part via a joint member, the pad moving mechanism is configured to hold the wiping pad in a standing posture and move the wiping pad from one end to another end of the nozzle along the nozzle long side direction,
the wiping pad comprising:
a front surface formed on a moving direction side;
a rear surface formed on a moving direction rear side;
inclined surfaces formed on an upper end of the rear surface on the moving direction rear side and inclined toward the moving direction side;
upper surface formed on an upper side of the front surface and an upper side of the inclined surfaces;
side surfaces formed on both left and right sides of the front surface, the rear surface, and the inclined surfaces; and
a V-shaped groove formed along the moving direction on a pad upper surface side by opposing inclined surfaces, the V-shaped groove further comprising:
a scraping edge formed on the inclined surfaces inclined toward the moving direction side by a rear end edge portion of the V-shaped groove and provided to cross a long side direction of the discharge port and come into contact with the discharge port and the nozzle side surfaces; and
a lead-out passage composed of the V-shaped groove, the lead-out passage is provided ahead of the scraping edge in a moving direction along the nozzle long side direction to drain the treatment solution scraped away with the scraping edge;

wherein the V-shaped groove is formed to gradually increase in groove width and depth toward a front thereof from the scraping edge,
wherein inclination angles of the inclined surfaces of the V-shaped groove with respect to the inclined surfaces inclined toward the moving direction side are formed to be 90° or more respectively.

7. A nozzle maintenance apparatus for wiping away a treatment solution adhering to a discharge port and nozzle side surfaces of a nozzle, the nozzle having the discharge port in a slit shape long in a width direction of a substrate to be treated and the nozzle side surfaces extending in parallel with the discharge port on both front and rear sides of the discharge port and formed in a tapered shape gradually getting thinner from a top to a bottom toward the discharge port, the nozzle maintenance apparatus comprising:
a wiping pad comprising a scraping edge provided to cross a long side direction of the discharge port and come into contact with the discharge port and the nozzle side surfaces, and a lead-out passage provided ahead of the scraping edge in a moving direction along the nozzle long side direction to drain the treatment solution scraped away with the scraping edge; and
a pad moving means configured to hold the wiping pad in a standing posture and move the wiping pad from one end to another end of the nozzle along the nozzle long side direction, wherein the scraping edge of the wiping pad is formed in a V-shape in a front view at an upper portion of a pad front surface in the moving direction, and provided with a flange part projecting forward on both right and left sides of the scraping edge and thereby formed in a V-shape widening from a middle to both right and left sides toward a front in a plan view, and the lead-out passage is formed of a pad front surface side including a lower surface of the flange part.

8. The nozzle maintenance apparatus according to claim 6,
wherein a cutout part having predetermined width and depth is provided at a predetermined portion of the scraping edge.

9. The nozzle maintenance apparatus according to claim 7,
wherein a cutout part having predetermined width and depth is provided at a predetermined portion of the scraping edge.

10. The nozzle maintenance apparatus according to claim 6, further comprising:
a nozzle bath provided to be arranged directly below the nozzle and configured to keep the discharge port and the nozzle side surfaces of the nozzle from which the treatment solution has been wiped away with the wiping pad, in an atmosphere of a solvent vapor.

11. The nozzle maintenance apparatus according to claim 6, further comprising:
a nozzle configured to supply a cleaning solution to the scraping edge and the V-shaped groove.

12. The nozzle maintenance apparatus according to claim 6, further comprising:
a supply port configured to supply a cleaning solution to the scraping edge and the V-shaped groove and provided at the V-shaped groove.

13. A coating treatment apparatus using a nozzle maintenance apparatus for wiping away a treatment solution adhering to a discharge port and nozzle side surfaces of a nozzle, the nozzle having the discharge port in a slit shape long in a width direction of a substrate to be treated and the nozzle side surfaces extending in parallel with the discharge port on both front and rear sides of the discharge port and formed in a tapered shape gradually getting thinner from a top to a bottom toward the discharge port, the nozzle maintenance apparatus comprising:
  a wiping pad; and
  a pad moving mechanism which includes a carriage combined with a Y-direction moving part via a joint member, the pad moving mechanism is configured to hold the wiping pad in a standing posture and move the wiping pad from one end to another end of the nozzle along the nozzle long side direction,
  the wiping pad comprising:
    a front surface formed on a moving direction side;
    a rear surface formed on a moving direction rear side;
    inclined surfaces formed on an upper end of the rear surface on the moving direction rear side and inclined toward the moving direction side;
    upper surfaces formed on an upper side of the front surface and an upper side of the inclined surfaces;
    side surfaces formed on both left and right sides of the front surface, the rear surface, and the inclined surfaces; and
    a V-shaped groove formed along the moving direction on a pad upper surface side by opposing inclined surfaces, the V-shaped groove further comprising:
      a scraping edge formed on the inclined surfaces inclined toward the moving direction side by a rear end edge portion of the V-shaped groove, the scraping edge is provided to cross a long side direction of the discharge port and come into contact with the discharge port and the nozzle side surfaces; and
      a lead-out passage composed of the V-shaped groove, the lead-out passage is provided ahead of the scraping edge in a moving direction along the nozzle long side direction to drain the treatment solution scraped away with the scraping edge;
    wherein the V-shaped groove is formed to gradually increase in groove width and depth toward a front thereof from the scraping edge, and
    wherein inclination angles of the inclined surfaces of the V-shaped groove with respect to the inclined surfaces inclined toward the moving direction side are formed to be 90° or more respectively, the coating treatment apparatus comprising:
  the nozzle maintenance apparatus;
  the nozzle configured to discharge the treatment solution from the discharge port in a slit shape extending in the width direction of the substrate to be treated to a substrate surface of the substrate to be treated; and
  a relative moving mechanism which includes a substrate transfer mechanism having guide rails, sliders and substrate holding members, the relative moving mechanism is configured to relatively move the nozzle and the substrate to be treated so that the nozzle scans from one end to another end of the substrate surface of the substrate to be treated.

* * * * *